United States Patent
Hayashi et al.

(10) Patent No.: US 9,735,733 B2
(45) Date of Patent: *Aug. 15, 2017

(54) QUANTUM INTERFERENCE DEVICE, ATOMIC OSCILLATOR, ELECTRONIC DEVICE, AND MOVING OBJECT

(71) Applicant: Seiko Epson Corporation, Tokyo (JP)

(72) Inventors: Nobuhito Hayashi, Chino (JP); Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/295,261

(22) Filed: Oct. 17, 2016

(65) Prior Publication Data

US 2017/0040946 A1    Feb. 9, 2017

Related U.S. Application Data

(63) Continuation of application No. 14/881,475, filed on Oct. 13, 2015, now Pat. No. 9,503,021.

(30) Foreign Application Priority Data

Oct. 14, 2014 (JP) .................. 2014-210062
Oct. 14, 2014 (JP) .................. 2014-210063

(51) Int. Cl.
*G04F 5/14* (2006.01)
*H03B 17/00* (2006.01)
*H03L 7/26* (2006.01)

(52) U.S. Cl.
CPC .............. *H03B 17/00* (2013.01); *G04F 5/14* (2013.01); *G04F 5/145* (2013.01); *H03L 7/26* (2013.01)

(58) Field of Classification Search
CPC ........... G04F 5/14; G04F 5/145; H03B 17/00; H03L 7/26
USPC ..................................... 331/3, 94.1
See application file for complete search history.

(56) References Cited

U.S. PATENT DOCUMENTS

| | | |
|---|---|---|
| 3,513,381 A | 5/1970 | Happer |
| 6,993,058 B2 | 1/2006 | Zhu |
| 7,098,744 B2 | 8/2006 | Hayes |
| 7,102,451 B2 | 9/2006 | Happer et al. |

(Continued)

FOREIGN PATENT DOCUMENTS

| | | |
|---|---|---|
| JP | 2007-527994 A | 10/2007 |
| JP | 2010-147967 A | 7/2010 |

(Continued)

*Primary Examiner* — Levi Gannon
(74) *Attorney, Agent, or Firm* — Harness, Dickey & Pierce, P.L.C.

(57) ABSTRACT

An atomic oscillator includes an atom cell, a first light source device, a second light source device, and a reception section. The atom cell is filled with alkali metal. The first light source device emits a light beam that includes a resonance light beam pair configured to be circularly polarized with each other in the same direction and configured to cause the alkali metal to resonate. The second light source device emits a light beam that includes adjustment light beam configured to be circularly polarized in a reverse direction to the resonance light beam pair. The reception device receives the resonance light beam pair that pass through the atom cell. The adjustment light beam may include the resonance light beam that causes the alkali metal to resonate. In addition, the resonance light beam pair may be a line and the adjustment light beam is a line.

10 Claims, 20 Drawing Sheets

(56) References Cited

U.S. PATENT DOCUMENTS

| | | |
|---|---|---|
| 7,378,913 B2 | 5/2008 | Laiacano et al. |
| 7,379,486 B2 | 5/2008 | Lust et al. |
| 8,237,514 B2 | 8/2012 | Aoyama et al. |
| 8,643,441 B2 | 2/2014 | Aoyama et al. |
| 8,816,783 B2 | 8/2014 | Lecomte et al. |
| 2009/0128820 A1 | 5/2009 | Nomura |
| 2014/0028405 A1 | 1/2014 | Hong |

FOREIGN PATENT DOCUMENTS

| | | |
|---|---|---|
| JP | 2010-199779 A | 9/2010 |
| JP | 2014-017824 A | 1/2014 |
| WO | WO-2005-081794 A2 | 9/2005 |

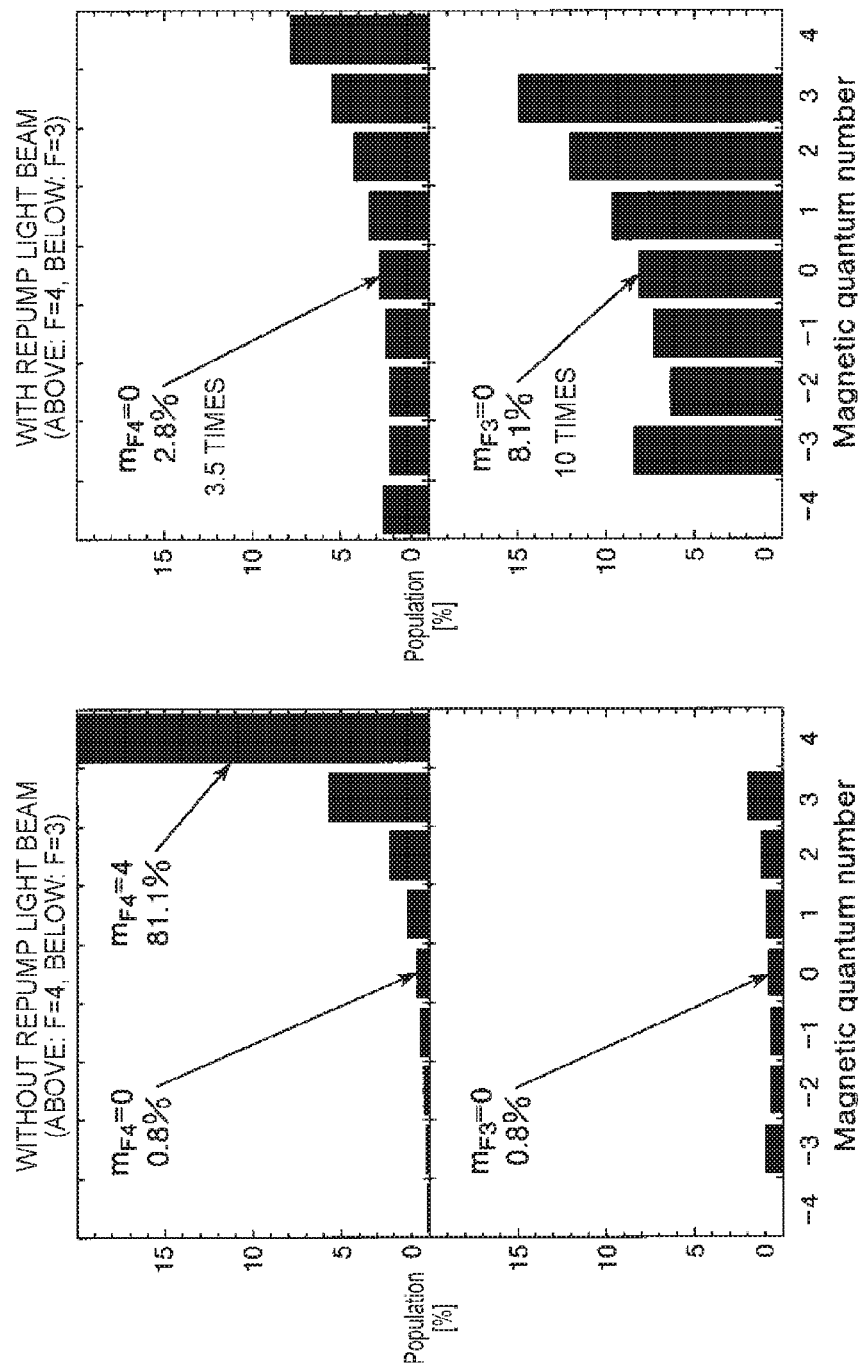

QUANTUM INTERFERENCE DEVICE, ATOMIC OSCILLATOR, ELECTRONIC DEVICE, AND MOVING OBJECT

CROSS-REFERENCE TO RELATED APPLICATIONS

This is a continuation patent application of U.S. application Ser. No. 14/881,475 filed Oct. 13, 2015 which claims priority to Japanese Patent Application No. 2014-210062 filed Oct. 14, 2014 and Japanese Patent Application No. 2014-210063 filed Oct. 14, 2014, all of which are hereby expressly incorporated by reference herein in their entireties.

BACKGROUND

1. Technical Field

The present disclosure relates to a quantum interference device, an atomic oscillator, an electronic device, and a moving object.

2. Related Art

As an oscillator, an atomic oscillator oscillates based on the transition of atomic energy of an alkali metal such as rubidium or cesium. The atomic oscillator may have highly accurate oscillation properties in the long term.

Generally, the operational principle of the atomic oscillator may be classified as a method using double resonance phenomena due to light beams and microwaves. The atomic oscillator may also be classified as a method using quantum interference effects (coherent population trapping (CPT)) due to two types of light beams having different wavelengths. In the methods, it is possible to miniaturize the atomic oscillator using the quantum interference effects rather than the atomic oscillator using the double resonance phenomena. Accordingly, an atomic oscillator can be mounted on various devices.

For example, JP-A-2014-17824 discloses an atomic oscillator using the quantum interference effects and includes, for example, a gas cell filled with gaseous alkali metal, a light source that resonates the alkali metal of the gas cell and emits a resonance light beam pair of two types of resonance light beams having different frequencies, and a light detector (reception device) that detects the resonance light beam pair that passes through the gas cell. In the atomic oscillator, an electromagnetically induced transparency (EIT) phenomenon, in which two types of resonance light beams pass through the gas cell without being absorbed into the alkali metal of the gas cell, occurs when the frequency difference of the two types of resonance light beams is a prescribed value. Further, in such an atomic oscillator, the light detector detects an EIT signal, which is a sharp signal generated in accordance with the EIT phenomenon, and uses the EIT signal as a reference signal.

From the point of view of increasing short-period frequency stability, it is preferable that the EIT signal has a small line width (half-value width) and high intensity. For example, in the atomic oscillator disclosed in JP-A-2014-17824, circularly polarized resonance light beam pairs are used in order to improve the intensity of the EIT signal.

However, the atomic oscillator disclosed in JP-A-2014-17824 has a problem in that the effect thereof is not sufficient.

SUMMARY

An advantage of some aspects of the present disclosure is to provide a quantum interference device which is capable of effectively improving the intensity of an EIT signal. Another advantage of some aspects of the present disclosure is to provide an atomic oscillator, an electronic device, and a moving object which respectively include the quantum interference device.

The present disclosure can be implemented as the following forms or application examples.

Application Example 1

This application example is directed to a quantum interference device including: an atom cell that is filled with metal; a first light source device that emits a first light beam that includes a resonance light beam pair configured to be circularly polarized with each other in the same direction and configured to cause the metal to resonate; a second light source device that emits a second light beam that is circularly polarized in a reverse direction to the resonance light beam pair; and a reception device that receives the resonance light beam pair that pass through the atom cell.

In addition to the resonance light beam pair that are circularly polarized with each other in the same direction, the metal is irradiated with the resonance light beam that is circularly polarized in a reverse direction to the resonance light beam pair as the adjustment light beam. Accordingly, it is possible to cancel or relieve a deviation in the distribution of the magnetic quantum numbers due to the resonance light beam pair using the adjustment light beam. Therefore, it is possible to reduce the deviation in the distribution of the magnetic quantum numbers of the metal. Therefore, the number of metal atoms corresponding to the desired magnetic quantum numbers which contribute to EIT is increased. As a result, when the circularly polarized resonance light beam pair is used, it is possible to remarkably express an advantage of improving the intensity of an EIT signal. Accordingly, it is possible to effectively improve the intensity of the EIT signal.

Application Example 2

In the quantum interference device according to the application example, the second light beam may include the resonance light beam that causes the metal to resonate.

With this configuration, it is possible to effectively adjust the distribution of the number of metal atoms.

Application Example 3

In the quantum interference device according to the application example, the resonance light beam pair may be a line D1 and the resonance light beam may be a line D2.

With this configuration, it is possible to effectively improve the intensity of the EIT signal.

Application Example 4

In the quantum interference device according to the application example, the second light beam may have a larger line width than the resonance light beam pair.

With this configuration, since the line width of the adjustment light beam is larger than that of the resonance light beam pair, it is possible to cause the metal atoms of wide velocity distribution to resonate with the adjustment light beam. Therefore, even when the central wavelength of the adjustment light beam is slightly deviated, it is possible to cause the adjustment light beam to resonate to the metal atoms at a desired velocity. As a result, it is not necessary to control the frequency of the adjustment light beam, and thus it is possible to simplify the configuration of the device.

Application Example 5

In the quantum interference device according to the application example, a wavelength of the second light beam may be separated from a wavelength of the resonance light beam pair.

With this configuration, it is possible to reduce the generation of unnecessary signals due to the adjustment light beam.

Application Example 6

In the quantum interference device according to the application example, in the atom cell, intensity of the first light beam may be smaller than intensity of the second light beam.

With this configuration, it is possible to effectively reduce the deviation in the magnetic quantum numbers of the metal.

Application Example 7

In the quantum interference device according to the application example, the first light source device may include a first light source that emits a linearly polarized light beam, the second light source device may include a second light source that emits a linearly polarized light beam, and the first light source device and the second light source device may include a common $\lambda/4$ wavelength plate through which the light beams from both the first light source and the second light source pass.

With this configuration, it is possible to simplify the configuration of the device.

Application Example 8

In the quantum interference device according to the application example, an optical axis of the first light beam and an optical axis of the second light beam may be perpendicular to each other.

With this configuration, it is possible to simplify the configuration of the device.

Application Example 9

The quantum interference device according to the application example may further include a separator that is arranged between the atom cell and the reception section and that separates the first light beam from the second light beam.

With this configuration, it is possible to prevent or reduce the reception section from receiving the adjustment light beam.

Application Example 10

In the quantum interference device according to the application example, in the atom cell, a transmission area of the first light beam may be included in a transmission area of the second light beam.

With this configuration, it is possible to effectively reduce the deviation in the distribution of the magnetic quantum numbers of the metal.

Application Example 11

In the quantum interference device according to the application example, the second light source device may include a light emitting diode that generates the second light beam.

With this configuration, it is possible to generate the adjustment light beam which has a wide line width with a relatively simple configuration.

Application Example 12

In the quantum interference device according to the application example, the second light source device may include a light source that emits a non-polarized light beam and a polarizer upon which the light beam from the light source is incident.

With this configuration, it is possible to generate the adjustment light beam which has a wide line width with a relatively simple configuration.

Application Example 13

In the quantum interference device according to the application example, the atom cell may include a pair of window parts and a body part that is arranged between the pair of window parts. The pair of window parts and the body part may form an internal space, which is filled with the metal. The second light beam passes through the body part and is incident upon the internal space.

With this configuration, it is possible to prevent or reduce the reception section from receiving the adjustment light beam.

Application Example 14

This application example is directed to a quantum interference device that reduces a deviation of distribution of magnetic quantum numbers of the metal by irradiating the metal with a resonance light beam pair, which are circularly polarized with each other in the same direction, and a resonance light beam which is circularly polarized in a reverse direction to the resonance light beam pair, thereby generating an electromagnetically induced transparency phenomenon.

In the quantum interference device, the metal is irradiated with the resonance light beam which is circularly polarized in a reverse direction to the resonance light beam pair as the adjustment light beam in addition to the resonance light beam pair which are circularly polarized with each other in the same direction, and thus it is possible to cancel or relieve a deviation in the distribution of the magnetic quantum numbers due to the resonance light beam pair using the adjustment light beam. Therefore, it is possible to reduce the deviation in the distribution of the magnetic quantum numbers of the metal. Therefore, the number of metal atoms corresponding to the desired magnetic quantum numbers which contribute to EIT is increased. As a result, when the circularly polarized resonance light beam pair is used, it is possible to remarkably express an advantage of improving the intensity of an EIT signal. Accordingly, it is possible to effectively improve the intensity of the EIT signal.

Application Example 15

This application example is directed to a quantum interference device including: an atom cell that is filled with metal; a first light source device that emits a first light beam that includes a resonance light beam pair configured to cause the metal to resonate; a second light source device that emits a second light beam that includes a resonance light beam configured to adjust magnetic quantum numbers of the metal; and a reception device that receives the resonance light beam pair that pass through the atom cell.

In the quantum interference device, the metal is irradiated with the resonance light beam which is circularly polarized in a reverse direction to the resonance light beam pair as the adjustment light beam in addition to the resonance light beam pair which are circularly polarized with each other in the same direction, and thus it is possible to cancel or relieve a deviation in the distribution of the magnetic quantum numbers due to the resonance light beam pair using the adjustment light beam. Therefore, it is possible to reduce the deviation in the distribution of the magnetic quantum numbers of the metal. Therefore, the number of metal atoms corresponding to the desired magnetic quantum numbers which contribute to EIT is increased. As a result, when the circularly polarized resonance light beam pair is used, it is possible to remarkably express an advantage of improving the intensity of an EIT signal. Accordingly, it is possible to effectively improve the intensity of the EIT signal.

Application Example 16

This application example is directed to an atomic oscillator including the quantum interference device according to the application example.

With this configuration, it is possible to provide the atomic oscillator which includes the quantum interference device in which it is possible to effectively improve the intensity of the EIT signal.

Application Example 17

This application example is directed to an electronic device including the quantum interference device according to the application example.

With this configuration, it is possible to provide the electronic device which includes the quantum interference device in which it is possible to effectively improve the intensity of the EIT signal.

Application Example 18

This application example is directed to a moving object including the quantum interference device according to the application example.

With this configuration, it is possible to provide the moving object in which it is possible to effectively improve the intensity of the EIT signal.

BRIEF DESCRIPTION OF THE DRAWINGS

The present disclosure will be described with reference to the accompanying drawings, wherein like numbers reference like elements.

FIG. 9A is a graph illustrating the distribution of the magnetic quantum numbers of cesium atoms when the cesium atoms are irradiated with only the resonance light beam pair.

FIG. 9B is a graph illustrating the distribution of the magnetic quantum numbers of the cesium atoms when the cesium atoms are irradiated with the resonance light beam pair and the adjustment light beam.

DESCRIPTION OF EXEMPLARY EMBODIMENTS

Hereinafter, a quantum interference device, an atomic oscillator, an electronic device, and a moving object according to the present disclosure will be described in detail based on embodiments with reference to the accompanying drawings.

1. Atomic Oscillator (Quantum Interference Device)

First, an atomic oscillator that includes a quantum interference device according to the present disclosure will be described. Specifically, an example in which the quantum interference device is applied to the atomic oscillator will be described. However, the quantum interference device of the present disclosure is not limited thereto. It is possible to apply the atomic oscillator of the present disclosure to, for example, a device such as a magnetic sensor or a quantum memory.

First Embodiment

First, an atomic oscillator according to a first embodiment of the present disclosure is described.

Figure 1:
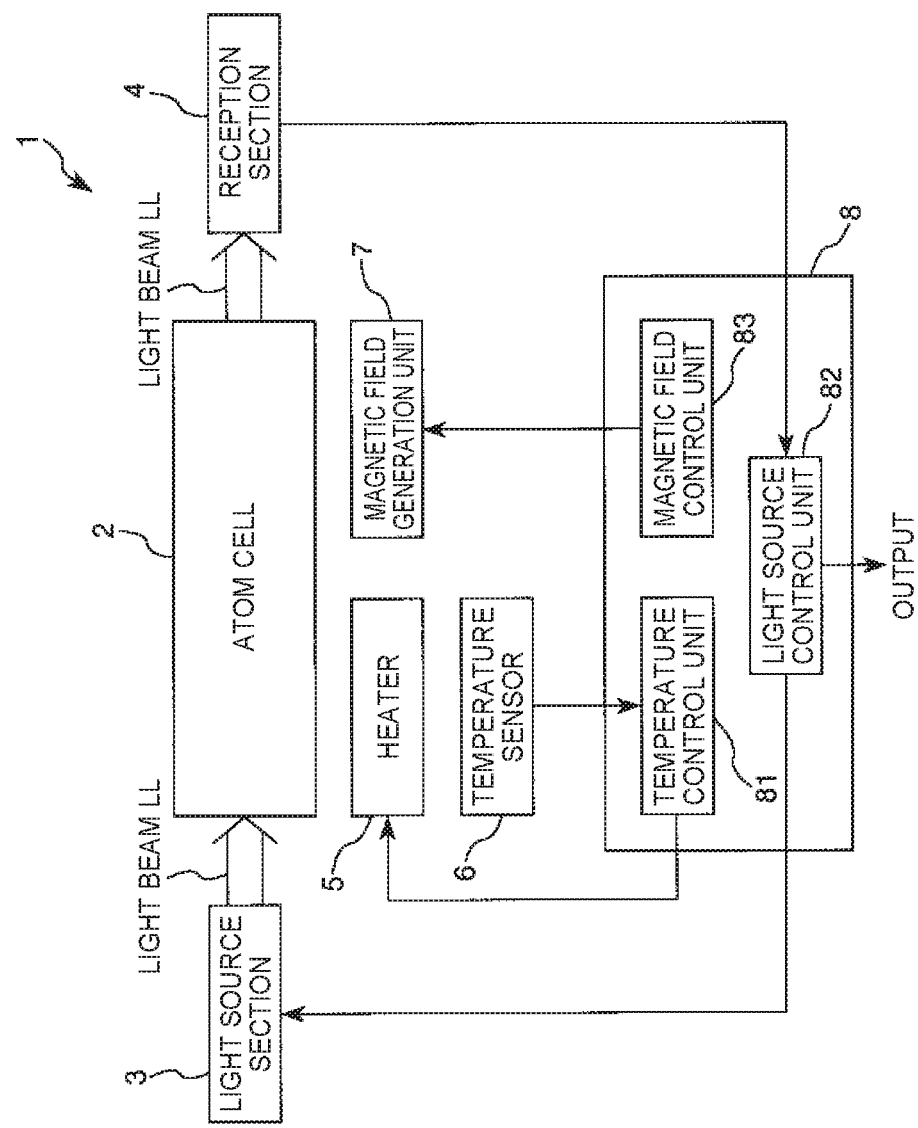
FIG. 1 is a schematic diagram illustrating an atomic oscillator (quantum interference device) according to the first embodiment of the present disclosure.
Figure 2:
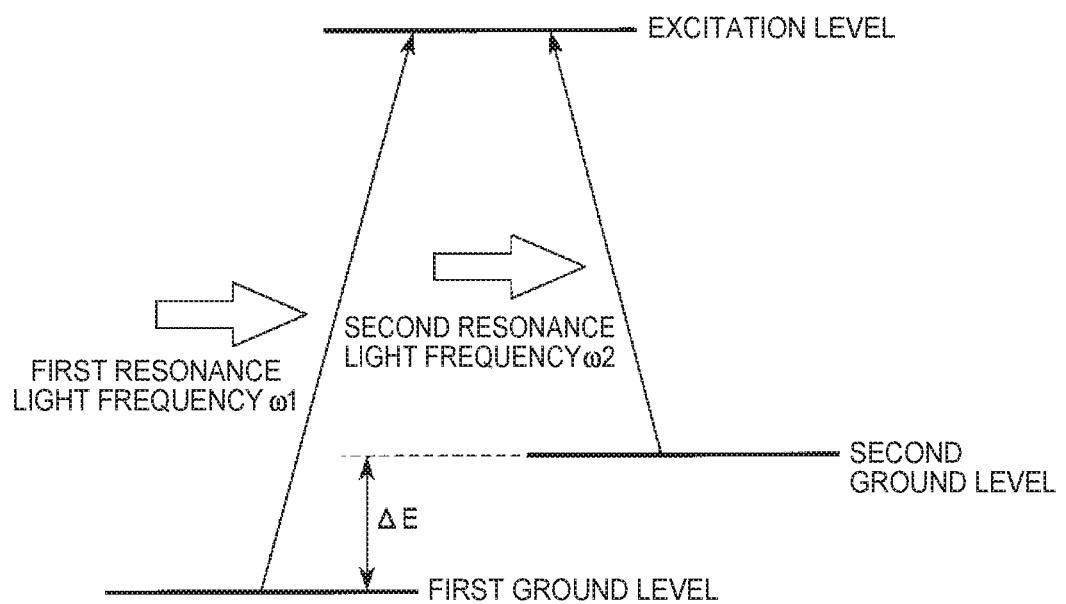
FIG. 2 is a diagram schematically illustrating the energy state of alkali metal atoms.
Figure 3:
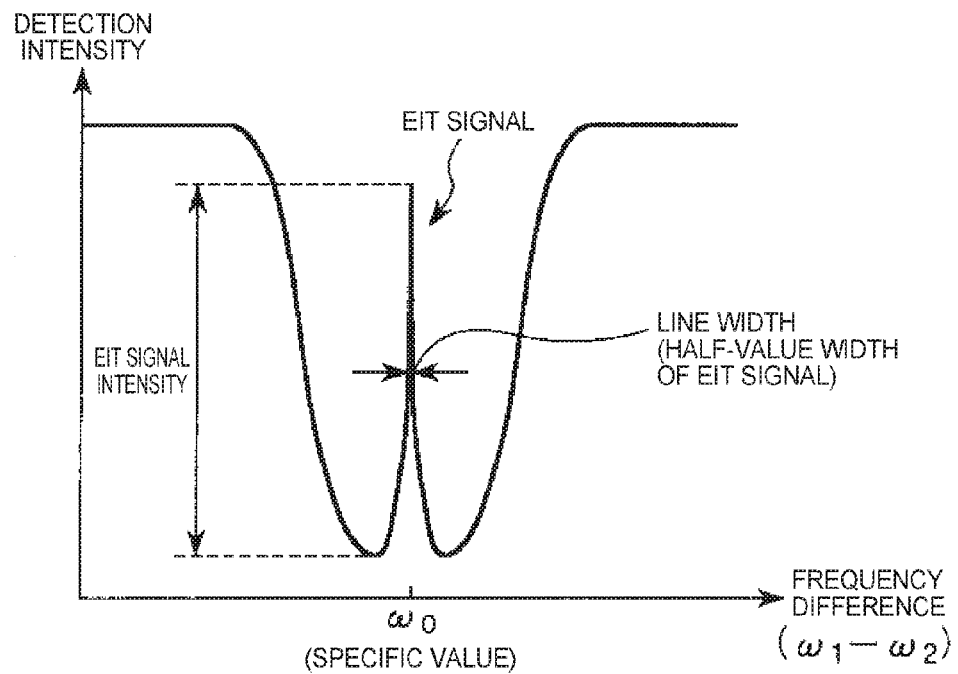
FIG. 3 is a graph illustrating the relationship between a frequency difference of two light beams emitted from a light source section and the intensity of the light beam detected by a reception section.

FIG. 1 is a schematic diagram illustrating the atomic oscillator (quantum interference device) according to the first embodiment of the present disclosure. FIG. 2 is a diagram schematically illustrating the energy state of alkali metal atoms. FIG. 3 is a graph illustrating the relationship between a frequency difference of two light beams emitted from a light source section and the intensity of light beam detected by a reception section.

With reference to FIG. 1, an atomic oscillator 1 uses quantum interference effects and includes an atom cell 2 (gas cell), a light source section 3, a reception section 4, a heater 5, a temperature sensor 6, a magnetic field generation unit 7, and a control unit 8.

First, the principle of the atomic oscillator 1 is described.

As shown in FIG. 1, in the atomic oscillator 1, the light source section 3 emits a light beam LL toward the atom cell 2, and the reception section 4 detects the light beam LL that passes through the atom cell 2.

The inside of the atom cell 2 is filled with gaseous alkali metal (metal atoms). As shown in FIG. 2, the alkali metal includes a three-level energy system that has two ground levels (a first ground level and a second ground level) and an excitation level. Here, the first ground level has an energy state that is lower than that of the second ground level.

The light beam LL, which is emitted from the light source section 3, includes a first resonance light beam and a second resonance light beam as two types of resonance light beams having different frequencies. When the gaseous alkali metal is irradiated with the first resonance light beam and the second resonance light beam, according to the difference between the frequency $\omega_1$ of the first resonance light beam and the frequency $\omega_2$ of the second resonance light beam (i.e., $\omega_1 - \omega_2$), the light absorption rate (light transmittance) of the alkali metal irradiated with the first resonance light beam and the second resonance light beam changes.

Further, when the difference between the frequency $\omega_1$ of the first resonance light beam and the frequency $\omega_2$ of the second resonance light beam coincides with a frequency corresponding to the energy difference $\Delta E$ between the first ground level and the second ground level, excitation from the first ground level to the excitation level and excitation from the second ground level to the excitation level stop, respectively. At this time, both the first resonance light beam and the second resonance light beam pass through the alkali metal without being absorbed into the alkali metal. Such a phenomenon is called a CPT phenomenon or an electromagnetically induced transparency (EIT) phenomenon.

For example, when the light source section 3 fixes the frequency $\omega_1$ of the first resonance light beam and changes the frequency $\omega_2$ of the second resonance light beam and when the difference between the frequency $\omega_1$ of the first resonance light beam and the frequency $\omega_2$ of the second resonance light beam coincides with the frequency $\omega_0$ corresponding to the energy difference $\Delta E$ between the first ground level and the second ground level, the intensity which is detected by the reception section 4 sharply rises as shown in FIG. 3. Such a sharp signal is detected as an EIT signal. The EIT signal has a unique value which is determined based on the type of the alkali metal. Accordingly, it is possible to construct a highly accurate oscillator using the EIT signal as a reference.

Hereinafter, each of the units of the atomic oscillator 1 will be described in brief.

Gas Cell

The inside of the atom cell 2 is filled with a gaseous alkali metal such as rubidium, cesium, and sodium. In addition, the inside of the atom cell 2 may be filled with noble gas, such as argon and neon, and inert gas, such as nitrogen, as buffer gas, together with alkali metal gas if necessary.

As described further below, the atom cell 2 includes a body part that includes through holes and a pair of window parts. The pair of window parts close the openings of the through holes of the body part, thereby forming an internal space that is filled with the gaseous alkali metal.

Light Emission Section

The light source section 3 emits the light beam LL that includes the first resonance light beam and the second resonance light beam, where the first and second resonance light beams form the resonance light beam pair that cause the alkali metal atoms in the atom cell 2 to resonate.

In addition, the light beam LL, which is emitted by the light source section 3, includes a third resonance light beam in addition to the first resonance light beam and the second resonance light beam.

The first resonance light beam is a light beam (probe light) that excites the alkali metal atoms in the atom cell 2 from the above-described first ground level to the excitation level. In contrast, the second resonance light beam is a light beam (coupling light) that excites the alkali metal atoms in the atom cell 2 from the above-described second ground level to the excitation level. Here, the first resonance light beam and the second resonance light beam are circularly polarized in the same direction with each other. In addition, the third resonance light beam is an "adjustment light beam" (repump light) that adjusts the magnetic quantum numbers of the alkali metal in the atom cell 2. The third resonance light beam is circularly polarized in the reverse direction of the first resonance light beam and the second resonance light beam. Therefore, it is possible to adjust the magnetic quantum numbers of the alkali metal atoms in the atom cell 2. The light source section 3 is described below. Meanwhile, when focusing on the vibration of one of the electric field component and the magnetic field component of light waves, the "circularly polarized light beam" is a light beam which rotates at the frequency of the light wave in a surface in which the vibration direction is perpendicular to the traveling direction of the light beam, and which has a uniform amplitude regardless of the direction. In other words, the "circularly polarized light beam" is the light beam in which the vibration of the electric field (or the magnetic field) draws a circle in accordance with propagation.

Reception Section

The reception section 4 detects the intensity of the light beam LL that passes through the inside of the atom cell 2. Particularly, the reception section 4 detects the resonance light beam pair that includes the first resonance light beam and the second resonance light beam. The reception section 4 may also be referred to as a reception device.

The reception section 4 is not particularly limited in a case of a detector that may detect the intensity of the light beam LL. The reception section 4 may be, for example, a light detector (light reception element), such as a photodiode that outputs a signal according to the intensity of a received light beam.

Heater

The heater 5 (heating section) heats the atom cell 2 and, more specifically, heats the alkali metal in the atom cell 2). The heater 5 maintains the alkali metal in the atom cell 2 in a gas state having an appropriate density.

The heater 5 includes, for example, heating resistor elements that generate heat due to current application. The heating resistor elements may be provided in a contact manner with the atom cell 2 or may be provided in a contactless manner with the atom cell 2.

More specifically, when the heating resistor elements are provided in the contact manner with the atom cell 2, the heating resistor elements are provided for a pair of window parts of the atom cell 2. Accordingly, the alkali metal atoms may not be condensed at the window parts of the atom cell 2. As a result, the oscillating property of the atomic oscillator 1 is improved for a long period of time. The heating resistor elements are formed of a material having transmittance for the light beam LL. For example, the heating resistor element may be a transparent electrode material of the oxide such as Indium Tin Oxide (ITO), Indium Zinc Oxide (IZO), $SnO_2$ including $In_2O_3$, $SnO_2$ and Sb, and ZnO including Al. In addition, it is possible to form the heating resistor element using, for example, a chemical vapor deposition (CVD) method, such as plasma CVD or thermal CVD, a dry plating method, such as vacuum deposition, a sol/gel method, and the like.

In addition, when the heating resistor element is provided for the atom cell 2 in a contactless manner, heat may be transferred from the heating resistor elements to the atom cell 2 through a member such as ceramics which are excellent in thermal conductivity.

Meanwhile, the heater 5 is not limited to the above-described embodiment. That is, it is possible to use other types of heaters to heat the atom cell 2. In addition, instead of the heater 5 or together with the heater 5, the temperature of the atom cell 2 may be adjusted using the Peltier element.

Temperature Sensor

The temperature sensor 6 detects the temperature of the heater 5 or the atom cell 2.

The temperature sensor 6 is arranged to come into contact with, for example, the heater 5 or the atom cell 2.

The temperature sensor 6 is not particularly limited, and it is possible to use various well-known temperature sensors such as a thermistor and a thermocouple.

Magnetic Field Generation Unit

The magnetic field generation unit 7 generates a magnetic field for the alkali metal in the atom cell 2. By enlarging the gaps between a plurality of different energy levels that degenerate the alkali metal atoms in the atom cell 2 through Zeeman splitting, it is possible to improve resolution. As a result, it is possible to improve the precision of the oscillation frequency of the atomic oscillator 1.

The magnetic field generation unit 7 may be formed of, for example, a coil that is wound along the periphery of the atom cell 2 so as to form a solenoid. Alternatively, the magnetic field generation unit 7 may be formed of a pair of coils that face each other through the atom cell 2, so as to form Helmholtz.

In addition, although the magnetic fields, which are generated by the magnetic field generation unit 7 are constant magnetic fields (direct current magnetic fields), alternating current magnetic fields may overlap.

Control Unit

The control unit 8 controls the light source section 3, the heater 5, and the magnetic field generation unit 7.

The control unit 8 includes a light source control unit 82 that controls the light source section 3, a temperature control unit 81 that controls the temperature of the alkali metal in the atom cell 2, and a magnetic field control unit 83 that controls the magnetic fields from the magnetic field generation unit 7.

The light source control unit 82 controls the frequencies of the first resonance light beam and the second resonance light beam emitted from the light source section 3 based on the detection results of the reception section 4. More specifically, the light source control unit 82 controls the frequencies of the first resonance light beam and the second resonance light beam which are emitted from the light source section 3 such that the frequency difference $(\omega_1-\omega_2)$ becomes the unique frequency $\omega_0$ of the alkali metal. Meanwhile, the configuration of the light source control unit 82 will be described later.

The temperature control unit 81 controls current application to the heater 5 based on the detection results from the temperature sensor 6. Therefore, it is possible to maintain the atom cell 2 in a desired temperature range. For example, the temperature of the atom cell 2 is adjusted at, for example, approximately 70° C. by the heater 5.

In addition, the magnetic field control unit 83 controls current application to the magnetic field generation unit 7 such that magnetic fields generated by the magnetic field generation unit 7 are constant.

The control unit 8 is provided in, for example, an IC chip which is mounted on a substrate.

Hereinabove, the configuration of the atomic oscillator 1 is described in brief.

Detailed Description of Light Source Section

Figure 4:
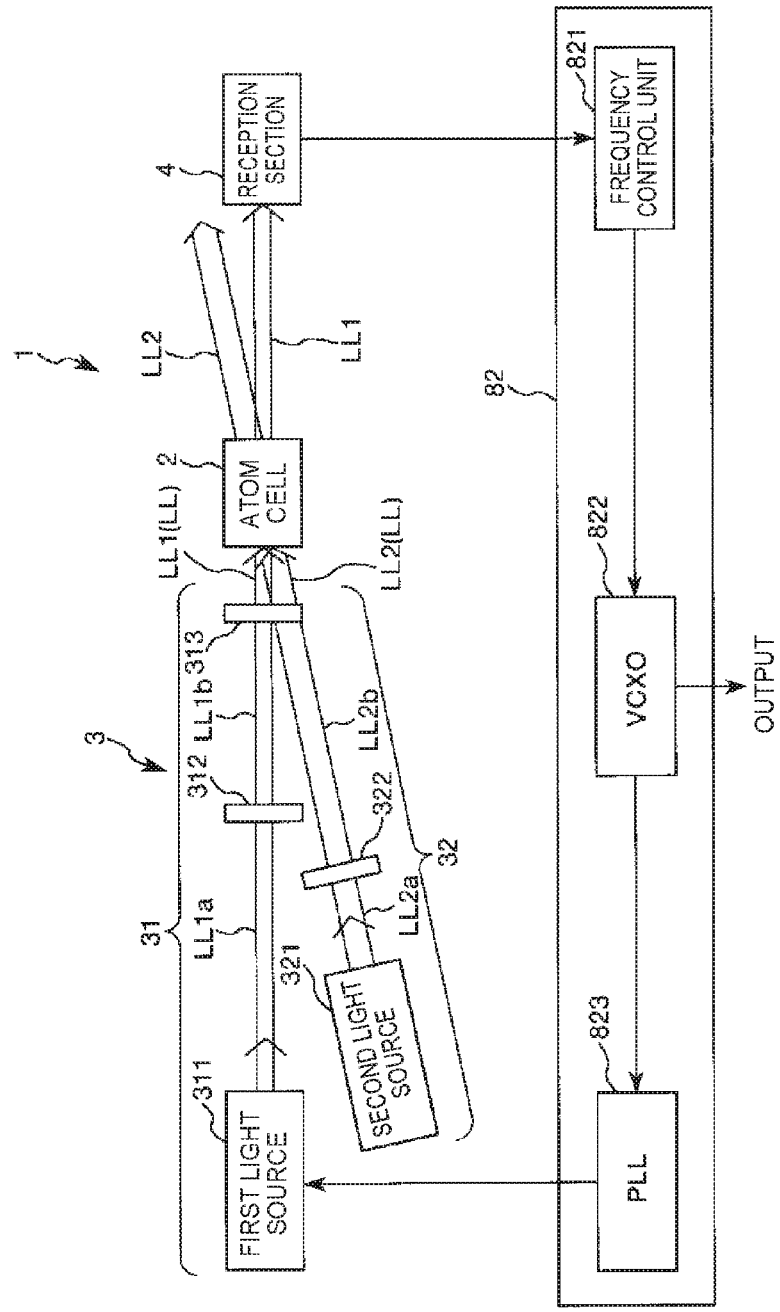
FIG. 4 is a schematic diagram illustrating the light source section included in the atomic oscillator shown in FIG. 1.
Figure 5:
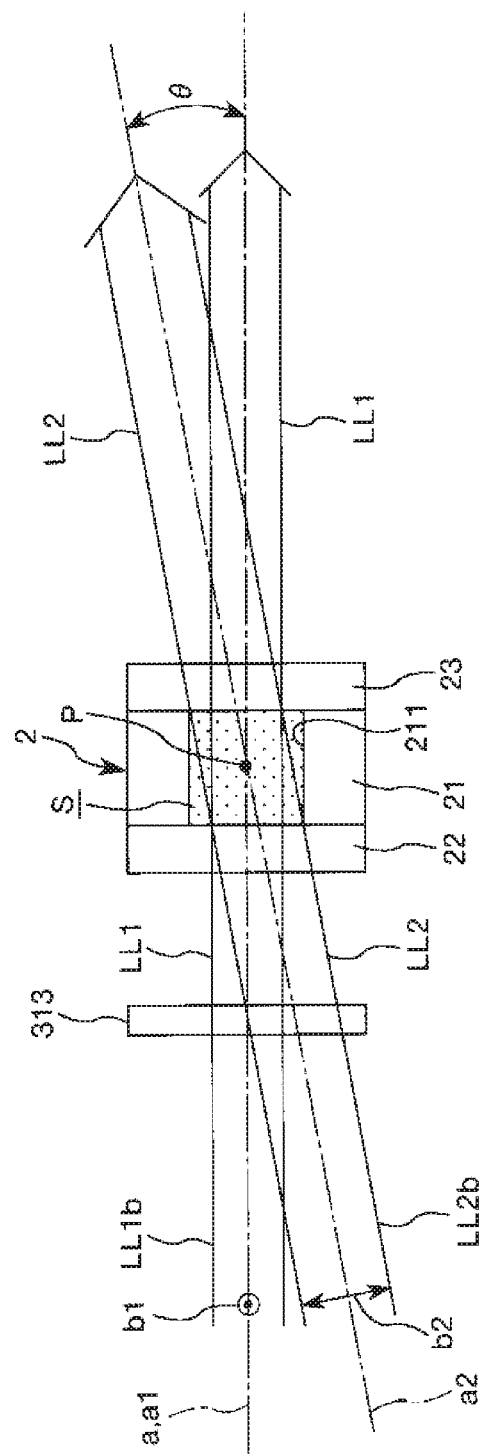
FIG. 5 is a diagram illustrating light beams respectively emitted from the first light source device and the second light source device of the light source section shown in FIG. 4.
Figure 6:
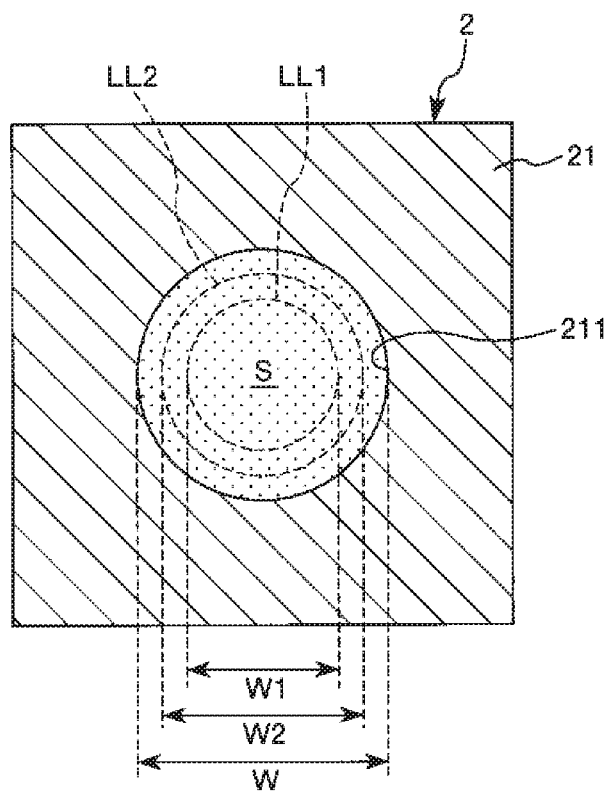
FIG. 6 is a cross-sectional diagram illustrating the atom cell shown in FIG. 5.

FIG. 4 is a schematic diagram illustrating the light source section included in the atomic oscillator shown in FIG. 1. FIG. 5 is a diagram illustrating light beams respectively emitted from the first light source device and the second light source device of the light source section shown in FIG. 4. FIG. 6 is a cross-sectional diagram illustrating the atom cell shown in FIG. 5, that is, a cross-sectional diagram perpendicular to the direction in which the pair of window parts is arranged.

As shown in FIG. 4, the light source section 3 includes a first light source device 31 and a second light source device 32. The first light source device 31 emits a resonance light beam pair LL1 including the first resonance light beam and the second resonance light beam as a first light beam. The second light source device 32 emits an adjustment light beam LL2 including the third resonance light beam as a second light beam.

The first light source device 31 includes a first light source 311, a $\lambda/2$ wavelength plate 312, and a $\lambda/4$ wavelength plate 313.

The first light source 311 emits a first light beam LL1a including a linearly-polarized resonance light beam pair. The first light source 311 is not particularly limited and includes, for example, semiconductor lasers such as a surface light emitting laser and a vertical cavity surface emitting laser (VCSEL). Meanwhile, a "linearly polarized light beam" is a light beam in which the vibrating surfaces of electromagnetic waves (light beams) are included in the same plane. In other words, the "linearly polarized light beam" is the light beam in which the vibration direction of the electric field (or the magnetic field) is constant.

The $\lambda/2$ wavelength plate 312 is a birefringent element that produces a phase difference $\pi(180°)$ between components that are perpendicular to each other. Accordingly, the $\lambda/2$ wavelength plate 312 generates a resonance light beam pair LL1b by changing the polarization direction of the first light beam LL1a, which is linearly polarized from the first light source 311, by 90°. Meanwhile, when the first light source 311 is installed in a posture which is rotated by 90° around the optical axis, the linearly polarized light beam, which is emitted from the first light source 311, is perpendicular to the polarization direction of the linearly polarized light beam which is emitted from a second light source 321. Therefore, it is possible to omit the $\lambda/2$ wavelength plate 312.

The $\lambda/4$ wavelength plate 313 is a birefringent element that produces a phase difference of $\pi/2(90°)$ between the polarized light beam components which are perpendicular to each other. The $\lambda/4$ wavelength plate 313 converts the resonance light beam pair LL1b, which is generated by the $\lambda/2$ wavelength plate 312, into the resonance light beam pair LL1 from the linearly polarized light beam to the circularly polarized light beam (including elliptically polarized light beam). Therefore, it is possible to generate the resonance light beam pair LL1 which includes the first resonance light beam and the second resonance light beam.

In contrast, the second light source device 32 includes a second light source 321, a light attenuation filter 322, and the $\lambda/4$ wavelength plate 313 which is common to the first light source device 31. Here, the $\lambda/4$ wavelength plate 313 may be included in the first light source device 31 or may be included in the second light source device 32.

The second light source 321 emits a second light beam LL2a that includes a resonance light beam that is linearly polarized in the same direction as the above-described first light source 311. The second light source 321 is not particularly limited, and may include, for example, a semiconductor laser, such as a surface light emitting laser or a vertical cavity surface emitting laser (VCSEL), and a light emitting element such as a light emitting diode (LED) or an organic electroluminescence (organic EL) element.

The light attenuation filter 322 (ND filter) generates a resonance light beam LL2b by reducing the intensity of the second light beam LL2a from the second light source 321. When the output of the second light source 321 is large, it is possible to set the adjustment light beam LL2, which is incident on the atom cell 2, to a desired light quantity. When the output of the second light source 321 is less than that of the first light source 311, it is possible to omit the light attenuation filter 322.

As described above, the $\lambda/4$ wavelength plate 313 is a birefringent element that produces the phase difference $\pi/2(90°)$ between the polarized light beam components that are perpendicular to each other. The $\lambda/4$ wavelength plate 313 converts the resonance light beam LL2b, which is generated by the light attenuation filter 322, into the adjustment light beam LL2 from the linearly polarized light beam to the circularly polarized light beam (including the elliptically polarized light beam). Therefore, it is possible to generate the adjustment light beam LL2 which includes the third resonance light beam. Here, the polarization direction (b2 direction shown in FIG. 5) of the linearly polarized resonance light beam LL2b is a direction (perpendicular direction) which is different from the polarization direction (b1 direction shown in FIG. 5) of the linearly polarized resonance light beam pair LL1b. Accordingly, when the resonance light beam pair LL1b and the resonance light beam LL2b pass through the common $\lambda/4$ wavelength plate 313, it is possible to generate the circularly polarized resonance light beam pair LL1 and the adjustment light beam LL2 which is circularly polarized in the direction which is reverse to that of the resonance light beam pair LL1. The first light source device 31 and the second light source device 32 include the common $\lambda/4$ wavelength plate 313 through which both the resonance light beam pair LL1 and the adjustment light beam LL2 pass. Therefore, compared to a case in which the first light source device 31 and the second light source device 32 respectively include $\lambda/4$ wavelength plates, it is possible to simplify the configuration of the device.

The light source section 3, which is constructed as described above, is controlled such that the first light source 311 emits the first resonance light beam and the second resonance light beam by the light source control unit 82.

The light source control unit 82 includes a frequency control unit 821, a voltage controlled crystal oscillator (VCXO) 822, and a phase locked loop (PLL) circuit 823.

The frequency control unit 821 detects an EIT state in the atom cell 2 based on the intensity of the light beam received by the reception section 4, and outputs a control voltage according to the results of the detection. Therefore, the frequency control unit 821 controls the VCXO 822 such that an EIT signal is detected in the reception section 4.

The VCXO 822 is controlled by the frequency control unit 821 for a desired oscillation frequency, and oscillates at, for example, a frequency of approximately several MHz to several tens of MHz. In addition, the output signal of the VCXO 822 is input to the PLL circuit 823 and is output as the output signal of the atomic oscillator 1.

The PLL circuit 823 multiplies the frequency of the output signal from the VCXO 822. The PLL circuit 823 oscillates at a frequency that is half of the frequency corresponding to the energy difference $\Delta E$ between two different ground levels of the above-described alkali metal atoms. The multiplied signal (high frequency signal) is input to the first light source 311 of the first light source device 31 as a driving signal after DC bias currents are superimposed. Therefore, when the light emitting element, such as the semiconductor laser, which is included in the first light source 311, is modulated, it is possible to emit the first resonance light beam and the second resonance light beam corresponding to two light beams between which the frequency difference is $\omega_0$ (ie., $\omega_1 - \omega_2 = \omega_0$). Here, control is performed such that the current value of the direct current bias current is a prescribed value by a bias control unit (not shown). Therefore, it is possible to control the central wavelength of the first resonance light beam and the second resonance light beam in a desired manner.

Meanwhile, the temperatures of the first light source 311 and the second light source 321 are respectively adjusted to prescribed temperatures by a temperature adjustment element, such as a heating resistor element or a Peltier element (not shown). In addition, when the temperatures of the first light source 311 and the second light source 321 are adjusted, it is possible to control the central wavelengths of light beams emitted from the first light source 311 and the second light source 321.

The atom cell 2 is irradiated with the resonance light beam pair LL1 and the adjustment light beam LL2 which are emitted from the first light source device 31 and the second light source device 32.

As shown in FIG. 5, the atom cell 2 includes a body part 21 and a pair of window parts 22 and 23 which interpose the body part 21. In the atom cell 2, the body part 21 is arranged between the pair of window parts 22 and 23, and the body part 21 and the pair of window parts 22 and 23 define and form (configure) the internal space S, which is filled with the gaseous alkali metal.

When more specifically described, the body part 21 has a plate shape and defines a through hole 211, which passes through the body part 21 in the thickness direction of the body part 21.

The composition material of the body part 21 is not particularly limited, and may include a glass material, a crystal, a metal material, a resin material, a silicon material, or the like as an example. In the materials, it is preferable to use any one of the glass material, the crystal, and the silicon material, and it is further preferable to use the silicon material. Therefore, even when a small atom cell 2, in which the width and the height are equal to or less than 10 mm, is formed, it is possible to easily form a high-precision body part 21 using a micro-fabrication technology such as etching. In particular, it is possible to perform micro-fabrication using etching on silicon. Accordingly, when the body part 21 is formed using silicon, it is possible to simply and highly-precisely form the body part 21 even when the size of the atom cell 2 is reduced. In addition, generally, the window parts 22 and 23 are formed of glass. However, silicon is excellent in thermal conductivity compared to glass. Accordingly, it is possible to make the heat radiation of the body part 21 excellent. In addition, when the window parts 22 and 23 are formed of glass, the body part 21 and the window parts 22 and 23 may be air-tightly bound through anodic bonding, and thus it is possible to improve the reliability of the atom cell 2.

The window part 22 is bonded to one side surface of the body part 21 and the window part 23 is bonded to the other side surface of the body part 21. Therefore, the one end opening of the through hole 211 is blocked by the window part 22 and the other end opening of the through hole 211 is blocked by the window part 23.

A method of bonding the body part 21 to the window parts 22 and 23 is based on the composition material of the parts, and should not be limited to air-tight bonding. For example, it is possible to use a bonding method using an adhesive, a direct bonding method, an anodic bonding method, a surface activation bonding method, or the like. It is preferable to use the direct bonding method or the anodic bonding method. Therefore, it is possible to air-tightly bond the body part 21 to the window parts 22 and 23, and it is possible to make the reliability of the atom cell 2 excellent.

Each of the window parts 22 and 23, which are bonded to the body part 21, has transmittance for the light beam LL from the light source section 3. Further, one side window part 22 is an incident side window part upon which the light beam LL in the internal space S of the atom cell 2 is incident, and the other side window part 23 is an emission side window part in which the light beam LL is emitted from the internal space S of the atom cell 2. In addition, the window parts 22 and 23 respectively have plate shapes.

The composition materials of the window parts 22 and 23 are not particularly limited if the composition materials have transmittance for the light beam LL as described above. For example, although a glass material, a crystal, or the like may be used as an example, it is preferable to use the glass material. Therefore, it is possible to realize the window parts 22 and 23 which have transmittance for the excited light beam. In addition, when the body part 21 is formed of silicon, it is possible to air-tightly bond the body part 21 to the window parts 22 and 23 through anodic bonding by forming the window parts 22 and 23 using glass, and thus it is possible to make the reliability of the atom cell 2 excellent. Meanwhile, it is possible to form the window parts 22 and 23 using silicon according to the thickness of the window parts 22 and 23 and the intensity of the light beam LL. In this case, it is possible to perform the direct bonding or the anodic bonding on the body part 21 and the window parts 22 and 23.

A gaseous alkali metal is mainly stored in the internal space S which is a space in the through hole 211 blocked by the window parts 22 and 23. The gaseous alkali metal, which is stored in the internal space S, is excited by the light beam LL. Here, at least a part of the internal space S forms a "light passage space" through which the light beam LL passes. In the embodiment, the cross section of the internal space S forms a circle. In contrast, the cross section of the light passage space forms a similar form (that is, the circle) to the cross section of the internal space S and is set to be slightly less than the cross section of the internal space S. Meanwhile, the cross sectional shape of the internal space S is not limited to the circle, and may be, for example, a polygon such as a rectangle or a pentagon, an elliptical shape, or the like.

As shown in FIG. 5, the optical axis a1 of the resonance light beam pair LL1 and the optical axis a2 of the adjustment light beam LL2 are offset by an inclined angle θ and intersect at an intersection point P. In addition, in FIG. 5, in the atom cell 2, the optical axis a1 of the resonance light beam pair LL1 is parallel to an axis line "a" along a direction in which the window parts 22 and 23 of the atom cell 2 are arranged. In contrast, the optical axis a2 of the adjustment light beam LL2 is inclined with respect to the axis line "a" by the inclined angle θ. Meanwhile, in FIG. 5, the optical axis a1 coincides with the axis line "a."

Here, on the side of the atom cell 2 to which the resonance light beam pair LL1 and the adjustment light beam LL2 are emitted, the reception section 4 is arranged on the optical axis a1 or the extension line thereof. The resonance light beam pair LL1, which passes through the atom cell 2, is received by the reception section 4. In contrast, the optical axis a2 is set such that the reception section 4 does not receive the adjustment light beam LL2 which passes through the atom cell 2. Therefore, it is possible to prevent or reduce the reception section 4 from receiving the adjustment light beam LL2.

In the embodiment, the adjustment light beam LL2, which passes through the atom cell 2, is incident on a reflection prevention section (not shown), so as not to be a stray light beam. Meanwhile, the adjustment light beam LL2, which passes through the atom cell 2, may be received by the light reception element, and the second light source device 32 may be controlled according to a detection result of the light reception element.

In addition, as shown in FIG. 6, in the atom cell 2, the width W2 of the adjustment light beam LL2 is larger than the width W1 of the resonance light beam pair LL1. Therefore, in the atom cell 2, the transmission area of the resonance light beam pair LL1 is included in the transmission area of the adjustment light beam LL2.

In addition, the width W2 of the adjustment light beam LL2 is less than the width W of the through hole 211 in the atom cell 2.

Figure 7:
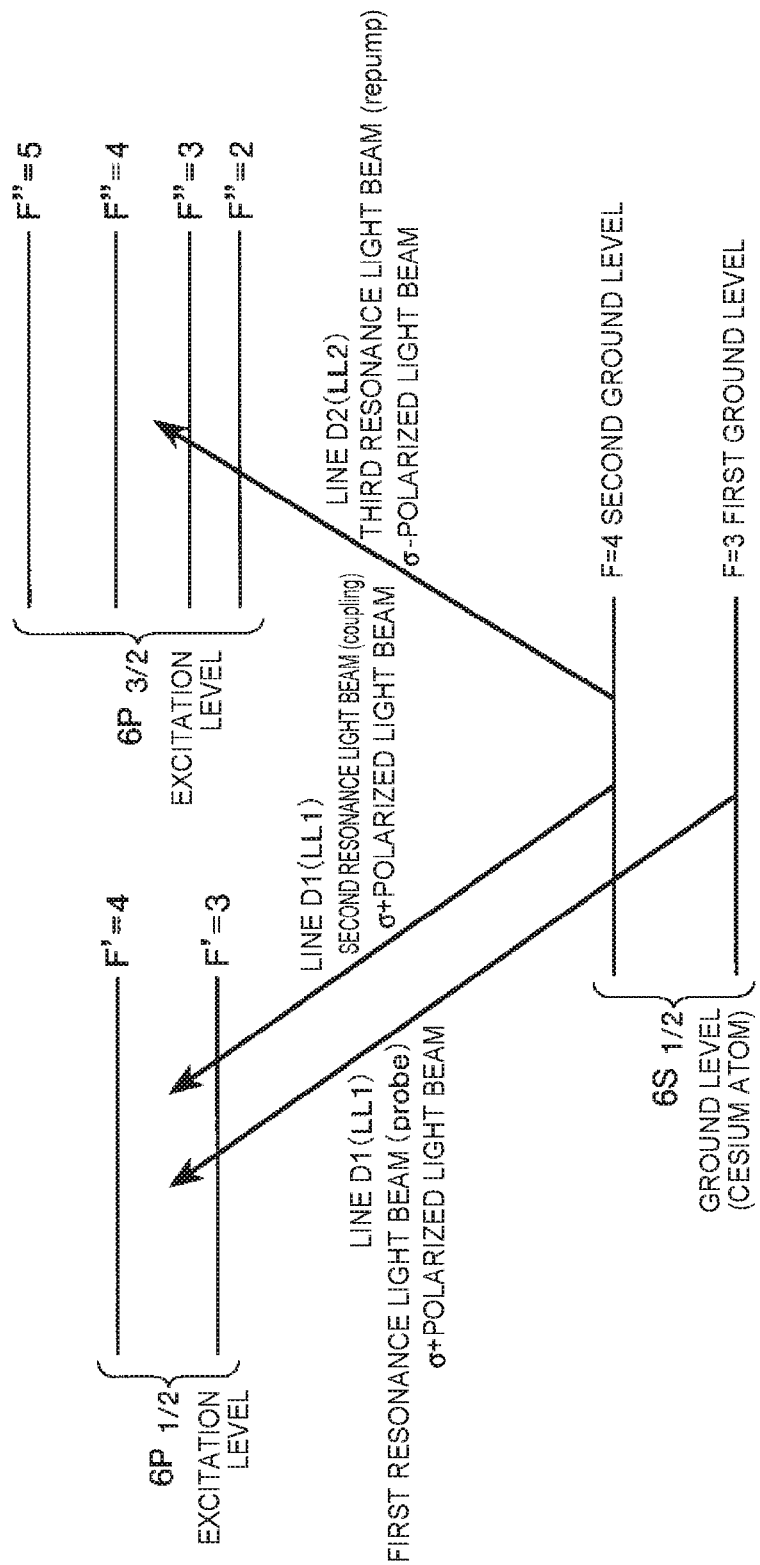
FIG. 7 is a diagram illustrating an example of the relationship between the energy state of cesium atoms, a resonance light beam pair (first resonance light beam and second resonance light beam), and adjustment light beam (third resonance light beam).

FIG. 7 is a diagram illustrating an example of the relationship between the energy state of cesium atoms and the resonance light beam pair (the first resonance light beam and the second resonance light beam) and the adjustment light beam (the third resonance light beam).

For example, when the atom cell 2 is filled with the cesium atoms, a $\sigma^+$-polarized (left-handed circularly polarized) line D1 is used as the first resonance light beam and the second resonance light beam (resonance light beam pair) and a $\sigma^-$-polarized (right-handed circularly polarized) line D2 is used as the third resonance light beam (adjustment light beam), as shown in FIG. 7. Meanwhile, the first resonance light beam and the second resonance light beam may be a $\sigma^-$-polarized light beam and the third resonance light beam may be a $\sigma^+$-polarized light beam. In addition, the first resonance light beam and the second resonance light beam may be the line D2, and the third resonance light beam may be the line D1.

The cesium atoms, which correspond to one type of the alkali metal atoms, include a ground level of $6S_{1/2}$ and two excitation levels of $6P_{1/2}$ and $6P_{3/2}$. In addition, the respective levels of $6S_{1/2}$, $6P_{1/2}$, and $6P_{3/2}$ include a microstructure that is divided into a plurality of energy levels. More specifically, the level of $6S_{1/2}$ includes two ground levels in which F=3, 4 is satisfied, the level of $6P_{1/2}$ includes two excitation levels in which F'=3, 4 is satisfied, and the level of $6P_{3/2}$ includes four excitation levels in which F''=2, 3, 4, 5 is satisfied.

The cesium atoms, which are at the first ground level of $6S_{1/2}$ (F=3), absorb the line D2, and thus transition to any one of the excitation levels of $6P_{3/2}$ (F''=2, 3, 4) is possible. However, transition to the excitation level (F''=5) is not possible. When the cesium atoms which are at the second ground level of $6S_{1/2}$ (F=4) absorb the line D2, transition to any one of the excitation levels of $6P_{3/2}$ (F''=3, 4, 5) is possible. However, transition to the excitation level (F''=2) is not possible. The reasons for these are based on a transition selection rule when electric dipole transition is assumed. In contrast, when the cesium atoms which are at any one of the excitation levels of $6P_{3/2}$ (F''=3, 4) emit the line D2, transition to the ground level (any one of an original ground level or the other side ground level) of $6S_{1/2}$ (F=3 or F=4) is possible. The three levels, which include the two ground levels of $6S_{1/2}$ (F=3, 4) and the excitation level of $6P_{3/2}$ (F''=3, 4), are called three $\Lambda$-type levels because $\Lambda$-type transition is possible by absorbing and light emitting the line D2. In the same manner, three levels, which include two ground levels of $6S_{1/2}$ (F=3, 4) and any one of the excitation levels of $6P_{1/2}$ (F'=3, 4) form the three $\Lambda$-type levels because $\Lambda$-type transition is possible by absorbing and light emitting the line D1.

In contrast, cesium atoms at the excitation level of $6P_{3/2}$ (F''=2) are necessarily in transition to the ground level (original ground level) of $6S_{1/2}$ (F=3) by emitting the line D2. In the same manner, cesium atoms at the excitation level of $6P_{3/2}$ (F''=5) are necessarily in transition to the ground level (original ground level) of $6S_{1/2}$ (F=4) by emitting the line D2. Accordingly, in three levels, which include the two ground levels of $6S_{1/2}$ (F=3, 4) and the excitation level of $6P_{3/2}$ (F=2 or F=5), it is difficult to perform $\Lambda$-type transition by absorbing and emitting the line D2, and thus the three $\Lambda$-type levels are not formed.

With regard to the cesium atoms, a wavelength of the line D1 in a vacuum is 894.593 nm, a wavelength of the line D2 in a vacuum is 892.347 nm, and a hyperfine splitting frequency ($\Delta$E) of $6S_{1/2}$ is 9.1926 GHz.

Meanwhile, the alkali metal atoms other than the cesium atoms include two ground levels and one excitation level which form the three $\Lambda$-type levels in the same manner. Here, with regard to the sodium atoms, a wavelength of the line D1 in vacuum is 589.756 nm, a wavelength of the line D2 in vacuum is 589.158 nm, and a hyperfine splitting frequency ($\Delta$E) of $3S_{1/2}$ is 1.7716 GHz. In addition, with regard to rubidium ($^{85}$Rb) atoms, a wavelength of the line D1 in vacuum is 794.979 nm, a wavelength of the line D2 in vacuum is 780.241 nm, and a hyperfine splitting frequency ($\Delta$E) of $5S_{1/2}$ is 3.0357 GHz. In addition, with regard to rubidium ($^{87}$Rb) atoms, a wavelength of the line D1 in vacuum is 794.979 nm, a wavelength of the line D2 in vacuum is 780.241 nm, and a hyperfine splitting frequency ($\Delta$E) of $5S_{1/2}$ is 6.8346 GHz.

Figures 8A, 8B:
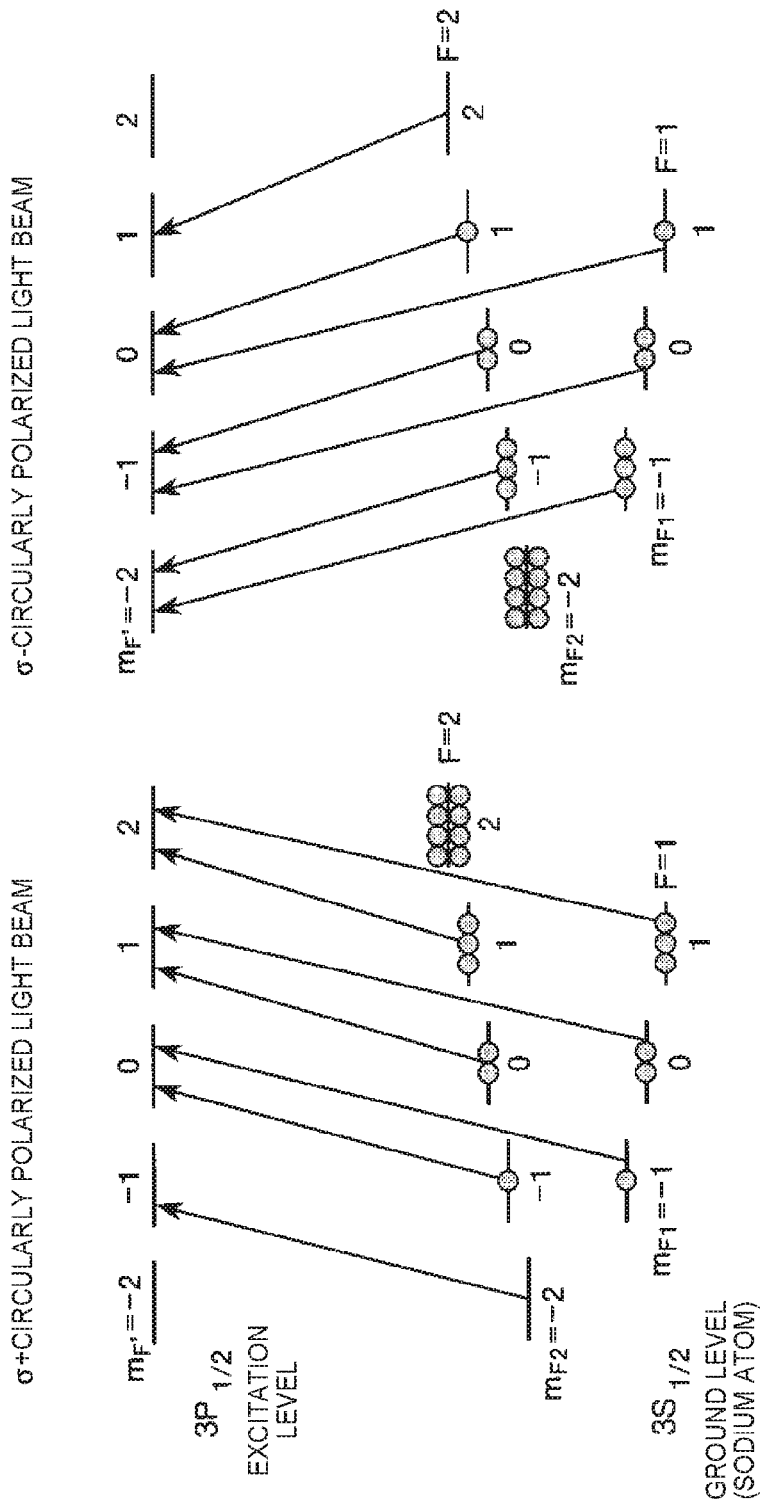
FIG. 8A is a diagram illustrating the distribution of the magnetic quantum numbers of sodium atoms when the sodium atoms are irradiated with $\sigma^+$ circularly-polarized resonance light beam.
FIG. 8B is a diagram illustrating the distribution of the magnetic quantum numbers of the sodium atoms when the sodium atoms are irradiated with $\sigma^-$ circularly-polarized resonance light beam.

FIGS. 8A and 8B are diagrams illustrating the distribution of the magnetic quantum numbers of the sodium atoms. FIG. 8A is a diagram illustrating the distribution of the magnetic quantum numbers of the sodium atoms when the sodium atoms are irradiated with $\sigma^+$ circularly-polarized resonance light beam. FIG. 8B is a diagram illustrating the distribution of the magnetic quantum numbers of the sodium atoms when the sodium atoms are irradiated with $\sigma^-$ circularly-polarized resonance light beam.

For example, as shown in FIGS. 8A and 8B, the sodium atoms, which correspond to one type of the alkali metal atoms, include the two ground levels and the excitation level which form the three $\Lambda$-type levels. The first ground level of $3S_{1/2}$ (F=1) includes three magnetic quantum numbers in which $m_{F1}$=−1, 0, and 1. The second ground level of $3S_{1/2}$ (F=2) includes five magnetic quantum numbers in which $m_{F2}$=−2, −1, 0, 1, and 2 is satisfied. The excitation level of $3P_{1/2}$ includes five magnetic quantum numbers in which $m_{F'}$=−2, −1, 0, 1, 2 is satisfied.

When the sodium atoms, which are at the ground level in which F=1 or F=2, are irradiated with the $\sigma^+$ circularly-polarized resonance light beam pair, the sodium atoms are excited to the excitation level based on a selection rule in which the magnetic quantum number increases by 1 as shown in FIG. 8A. Here, the distribution of the sodium atoms, which are at the ground level in which F=1 or F=2, changes in a direction in which the magnetic quantum number is large.

In contrast, when the sodium atoms, which are at the ground level in which F=1 or F=2, are irradiated with the $\sigma^-$ circularly-polarized resonance light beam pair, the sodium atoms are excited to the excitation level based on a selection rule in which the magnetic quantum number decreases by 1 as shown in FIG. 8B. Here, the distribution of the sodium atoms, which are at the ground level in which F=1 or F=2, changes in a direction in which the magnetic quantum number is small.

Meanwhile, in FIGS. 8A and 8B, for convenience of explanation, the distribution of the magnetic quantum numbers is shown using the sodium atoms having simple configuration as an example. However, in other alkali metal atoms, each of the ground level and the excitation level includes 2F+1 magnetic quantum numbers (magnetic sublevels), and the distribution of the magnetic quantum numbers changes based on the above-described selection rule.

FIGS. 9A and 9B are graphs illustrating the distribution of the magnetic quantum numbers of the cesium atoms. FIG. 9A is a graph illustrating the distribution of the magnetic quantum numbers of the cesium atoms when the cesium atoms are irradiated with only the resonance light beam pair. FIG. 9B is a graph illustrating the distribution of the magnetic quantum numbers of the cesium atoms when the cesium atoms are irradiated with the resonance light beam pair and the adjustment light beam.

When the cesium atoms are irradiated with only the resonance light beam pair LL1, the cesium atoms at the first ground level have a small deviation in the distribution of the magnetic quantum numbers $m_{F3}$ but the number thereof is small, as shown in FIG. 9A. In addition, the cesium atoms at the second ground level are significantly deviated in a direction in which the distribution of the magnetic quantum number $m_{F4}$ is large.

That is, in an atomic oscillator according to the related art (for example, the atomic oscillator disclosed in JP-A-2014-17824), all of the resonance light beam, with which the metal is irradiated, is circularly polarized in one direction. Therefore, it is possible to improve the intensity of the EIT signal compared to a case in which, for example, the resonance light beam is linearly polarized, but the advantage thereof is not sufficient. The reason for this is that, since all the resonance light beam is circularly polarized in one direction, the distribution is deviated in a direction in which the magnetic quantum number of the metal is small or large, and thus the number of metal atoms corresponding to the desired magnetic quantum number, which contributes to the EIT, is small as a result.

In contrast, when the cesium atoms are simultaneously irradiated with the resonance light beam pair LL1 and the adjustment light beam LL2, the cesium atoms, which are respectively at the first ground level and the second ground level, have the relatively small deviation in the distribution of the magnetic quantum numbers $m_{F3}$ and $m_{F4}$ and have the relatively large numbers, as shown in FIG. 9B. In particular, it is possible to cause the number of cesium atoms, in which the magnetic quantum numbers $m_{F3}$, $m_{F4}=0$ are satisfied which are stable for the magnetic fields, to be large. That is, when the cesium atoms are simultaneously irradiated with both the resonance light beam pair LL1 and the adjustment light beam LL2, it is possible to increase the number of cesium atoms at the respective levels of the first ground level and the second ground level, and to average the distribution of the magnetic quantum numbers of the cesium atoms, compared to the case in which the cesium atoms are irradiated with only the resonance light beam pair LL1.

Figure 10:
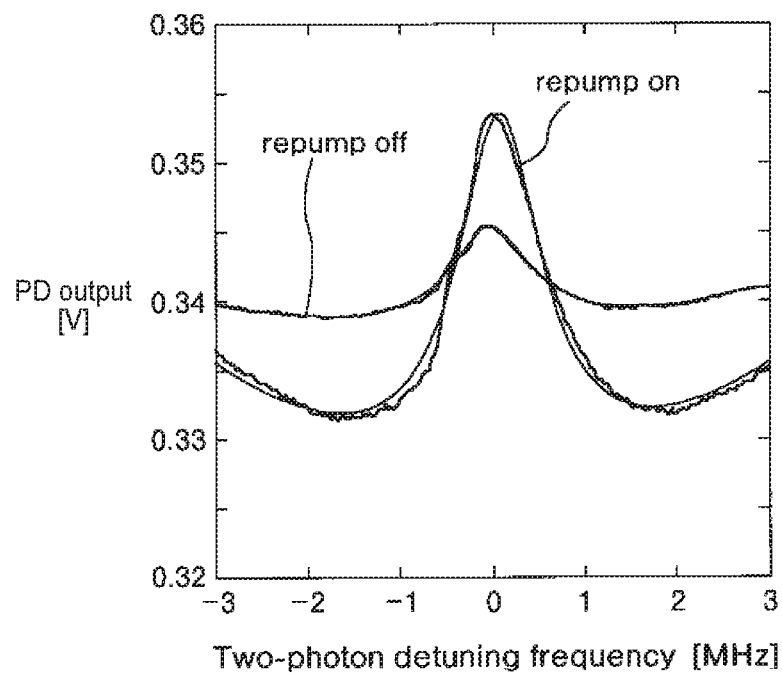
FIG. 10 is a graph illustrating the difference in an EIT signal based on the existence/non-existence of the adjustment light beam.

FIG. 10 is a graph illustrating the difference in the EIT signal based on the existence/non-existence of the adjustment light beam.

As shown in FIG. 10, when the cesium atoms are simultaneously irradiated with both the resonance light beam pair LL1 and the adjustment light beam LL2 (repump on), it is possible to increase the signal intensity of the EIT signal up to three times, compared to a case in which the cesium atoms are irradiated with only the resonance light beam pair LL1 (repump off) while maintaining the substantially equivalent full width at half value.

Meanwhile, the results shown in FIGS. 9A and 9B and FIG. 10 are acquired by setting the intensity of adjustment light beam (photon flux density) in the atom cell 2 to approximately half of the resonance light beam pair using the resonance light beam pair (the first resonance light beam and the second resonance light beam) and the adjustment light beam (the third resonance light beam) of the polarized light beam shown in FIG. 7.

As described above, in the atomic oscillator 1, the alkali metal is irradiated with the adjustment light beam LL2 which is circularly polarized in a reverse direction to the resonance light beam pair LL1 in addition to the resonance light beam pair LL1 which are circularly polarized with each other in the same direction, and thus it is possible to cancel or relieve the deviation in the distribution of the magnetic quantum numbers due to the resonance light beam pair LL1 using the adjustment light beam LL2. Therefore, it is possible to reduce the deviation in the distribution of the magnetic quantum numbers of the alkali metal. Therefore, the number of alkali metal atoms corresponding to the desired magnetic quantum number which contributes to EIT is increased. As a result, when the circularly polarized resonance light beam pair LL1 is used, it is possible to remarkably express an advantage of improving the intensity of an EIT signal. Accordingly, it is possible to effectively improve the intensity of the EIT signal.

Here, in a case shown in FIG. 7, the wavelength of the adjustment light beam LL2 is different from those of the resonance light beam pair LL1. That is, the wavelength of the adjustment light beam LL2 is separated from the wavelength of the resonance light beam pair LL1. Therefore, it is possible to reduce the generation of unnecessary signals due to the adjustment light beam LL2.

In addition, as shown in FIG. 7, when the resonance light beam pair LL1 is a line D1 and the adjustment light beam LL2 is a line D2, it is possible to effectively produce the EIT phenomenon. As a result, it is possible to effectively improve the intensity of the EIT signal.

In addition, in the atom cell 2, the intensity of the adjustment light beam LL2 (photon flux density) is less than that of the resonance light beam pair LL1. Therefore, it is possible to effectively reduce the deviation in the magnetic quantum numbers of the alkali metal in the atom cell 2.

In addition, when the intensity of the adjustment light beam LL2 is too strong, the distribution of the magnetic quantum numbers of the alkali metal in the atom cell 2 is strongly deviated to an opposite side of the deviation in the distribution of the magnetic quantum numbers due to the resonance light beam pair LL1. In contrast, when the intensity of the adjustment light beam LL2 is too weak, it is difficult to sufficiently cancel or relieve the deviation in the distribution of the magnetic quantum numbers due to the resonance light beam pair LL1 using the adjustment light beam LL2.

From such a point of view, when it is assumed that the photon flux density of the resonance light beam pair LL1 in the atom cell 2 is D1 and the photon flux density of the adjustment light beam LL2 in the atom cell 2 is D2, it is preferable that D2/D1 is 0.1 or larger and 0.9 or less, it is further preferable that D2/D1 is 0.2 or larger and 0.7 or less, and it is further preferable that D2/D1 is 0.3 or larger and 0.5 or less.

Here, it is possible to adjust the intensity of the adjustment light beam LL2 based on the light attenuation rate of the light attenuation filter 322. In addition, it is possible to adjust the intensity of the adjustment light beam LL2 by adjusting the driving current of the second light source 321.

In addition, in the atom cell 2, the transmission area of the resonance light beam pair LL1 is included in the transmission area of the adjustment light beam LL2, and thus it is possible to effectively reduce the deviation in the distribution of the magnetic quantum numbers of the alkali metal.

In addition, in the embodiment, the optical axis a1 of the resonance light beam pair LL1 and the optical axis a2 of the adjustment light beam LL2 intersect with each other at the intersection point P in the atom cell 2, as described above. Therefore, optical components for compounding the resonance light beam pair LL1 and the adjustment light beam LL2 are not necessary, and thus it is possible to simplify the configuration of the device.

Here, it is preferable that the inclined angle θ of the optical axis a1 of the resonance light beam pair LL1 for the optical axis a2 of the adjustment light beam LL2 in the atom cell 2 is 1° or larger and 30° or less, and it is further preferable that the inclined angle θ is 2° or larger and 10° or less. Therefore, it is possible to easily adjust the distribution of the magnetic quantum numbers due to the adjustment light beam LL2 while miniaturizing and simplifying the device. In contrast, there is a tendency that, when the inclined angle θ is too small, the degree of freedom of installation of the first light source 311 and the second light source 321 is extremely small, thereby causing the size of the device to increase. In contrast, there is a tendency that, when the inclined angle θ is too large, the second light source device 32 should be designed by taking the Doppler widths of the alkali metal atoms in the atom cell 2 into consideration, and thus design is difficult.

Modification Example

Figure 11:
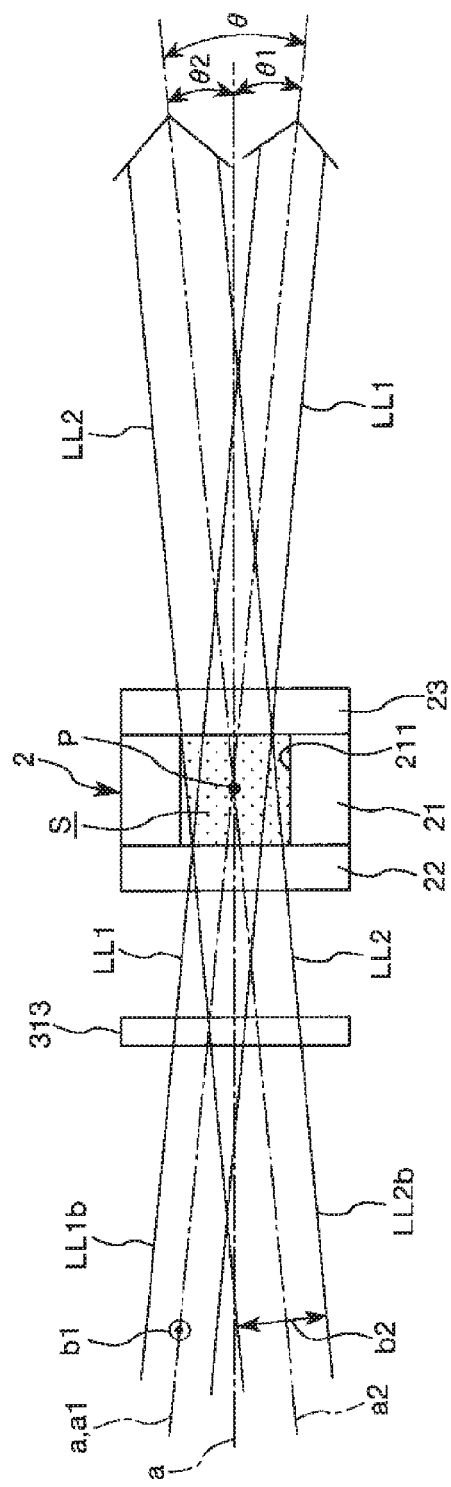
FIG. 11 is a diagram illustrating light beams respectively emitted from the first light source device and the second light source device of a light source section according to a modification example of the first embodiment of the present disclosure.

FIG. 11 is a diagram illustrating light beams respectively emitted from the first light source device and the second light source device of a light source section according to a modification example of the first embodiment of the present disclosure.

In the modification example shown in FIG. 11, in the atom cell 2, the optical axis a1 of the resonance light beam pair LL1 is offset with respect to the axis line "a" by an inclined angle θ1. In contrast, in the atom cell 2, the optical axis a2 of the adjustment light beam LL2 is offset with respect to the axis line "a" on the opposite side of the optical axis a1 by the inclined angle θ2. Therefore, it is possible to realize a configuration in which the symmetry of the axis line "a" is high.

Here, in the modification example shown in FIG. 11, similarly to the above-described example shown in FIG. 5, in the atom cell 2, the optical axis a1 of the resonance light beam pair LL1 is offset with respect to the optical axis a2 of the adjustment light beam LL2 by the inclined angle θ, and intersects the optical axis a2 at the intersection point P. Accordingly, the inclined angle θ is the sum of an inclined angle θ1 and an inclined angle θ2.

Although FIG. 11 shows the case in which the inclined angle θ1 and the inclined angle θ2 are equal to each other, the inclined angle θ1 and the inclined angle θ2 may be different from each other.

Second Embodiment

Subsequently, a second embodiment of the present disclosure will be described.

Figure 12:
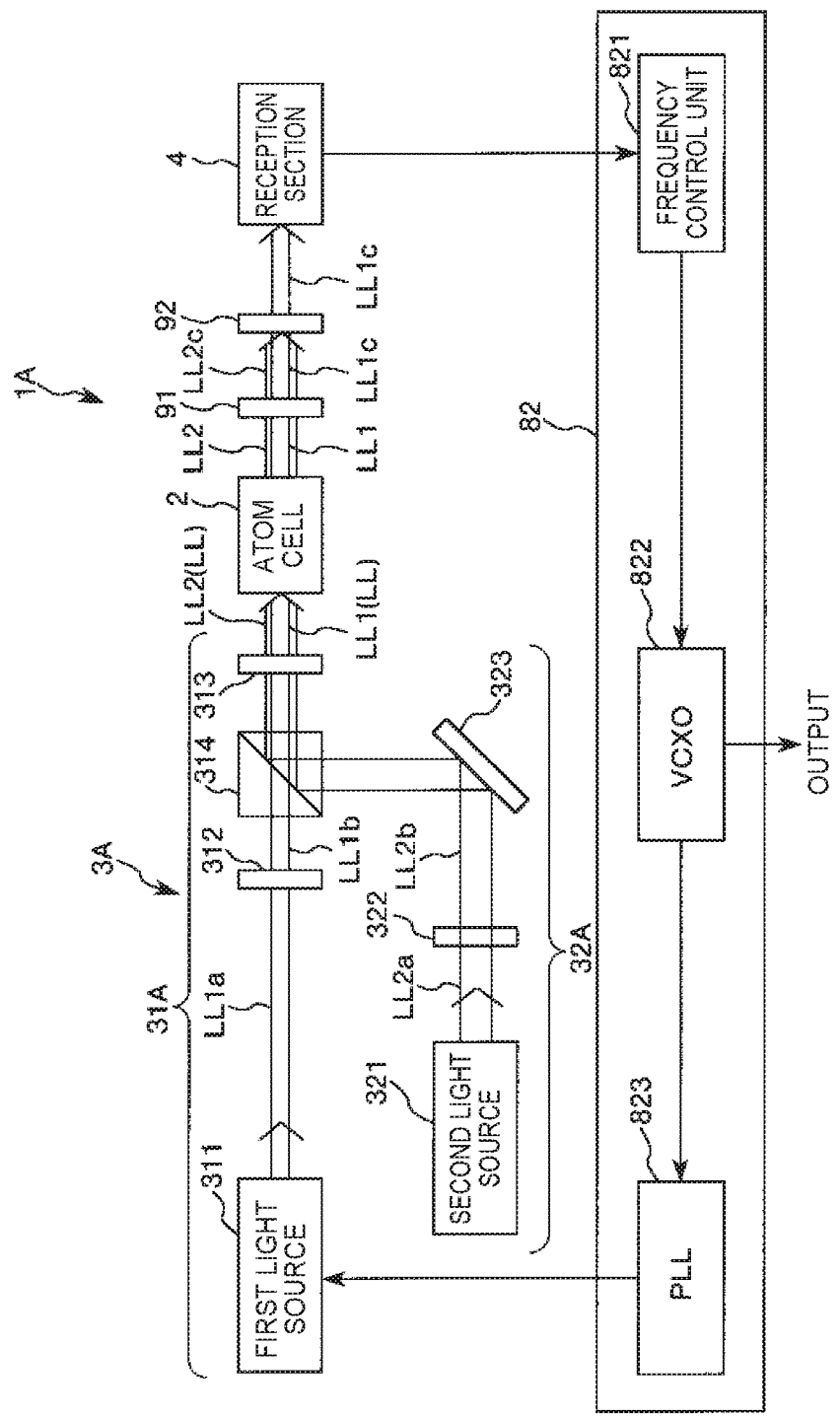
FIG. 12 is a schematic diagram illustrating an atomic oscillator (quantum interference device) according to a second embodiment of the present disclosure.
Figure 13:
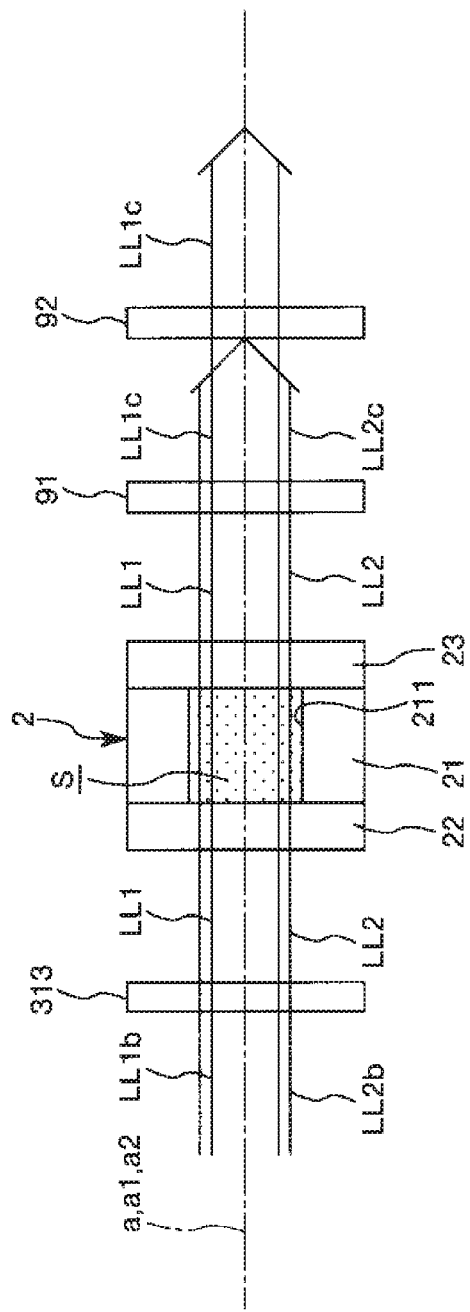
FIG. 13 is a diagram illustrating light beams respectively emitted from the first light source device and the second light source device of the light source section shown in FIG. 12.

FIG. 12 is a schematic diagram illustrating an atomic oscillator (quantum interference device) according to the second embodiment of the present disclosure. FIG. 13 is a diagram illustrating light beams respectively emitted from the first light source device and the second light source device of a light source section shown in FIG. 12.

This embodiment is the same as the first embodiment except that the configurations of the first light source device and the second light source device are different from those of the first embodiment and a λ/4 wavelength plate and a polarizer are added between the atom cell and the reception section.

In the description below, the second embodiment will be described based on the difference from the above-described embodiment, and the same matters will not be repeated. In addition, in FIGS. 12 and 13, the same reference symbols are used for the same configurations as those of the above-described embodiment.

An atomic oscillator 1A shown in FIG. 12 includes a light source section 3A, a λ/4 wavelength plate 91, and a polarizer 92.

The light source section 3A includes a first light source device 31A which emits a resonance light beam pair LL1, and a second light source device 32A which emits adjustment light beam LL2.

The first light source device 31A is formed to be the same as the first light source device 31 according to the above-described first embodiment except that the polarization beam splitter 314 is added between the λ/2 wavelength plate 312 and the λ/4 wavelength plate 313. That is, the first light source device 31A includes the first light source 311, the λ/2 wavelength plate 312, the λ/4 wavelength plate 313, and the polarization beam splitter 314.

In addition, the second light source device 32A is formed to be the same as the second light source device 32 according to the first embodiment except that a mirror 323 and the polarization beam splitter 314 are added between the light attenuation filter 322 and the λ/4 wavelength plate 313. That is, the second light source device 32A includes the second light source 321, the light attenuation filter 322, the mirror 323, and the polarization beam splitter 314.

In the first light source device 31A and the second light source device 32A, the polarization beam splitter 314 is provided to be shared by the first light source device 31A and the second light source device 32A. In the first light source device 31A, the polarization beam splitter 314 causes the resonance light beam pair LL1b to pass therethrough without change and to be incident upon the λ/4 wavelength plate 313. In contrast, in the second light source device 32A, the polarization beam splitter 314 causes the resonance light beam LL2b, which is reflected in the mirror 323, to be reflected and to be incident upon the λ/4 wavelength plate 313. That is, the resonance light beam pair LL1b and the resonance light beam LL2b are composed by the polarization beam splitter 314 such that the optical axes thereof coincide with each other, and are incident upon the λ/4 wavelength plate 313.

Here, the mirror 323 and the polarization beam splitter 314 form a "composite section" which compounds the resonance light beam pair LL1b and the resonance light beam LL2b. It is possible to cause the optical axes of the resonance light beam pair LL1b and the resonance light beam LL2b to coincide with each other and to cause the atom cell 2 to be irradiated with the resonance light beam pair LL1b and the resonance light beam LL2b using the composite section. Meanwhile, the mirror 323 may be omitted. In this case, the second light source 321 and the light attenuation filter 322 may be installed such that the resonance light beam LL2b is incident on the polarization beam splitter 314.

Meanwhile, a λ/2 wavelength plate may be installed instead of the light attenuation filter 322. When the λ/2 wavelength plate is used, it is possible to reduce or increase the intensity of the second light beam LL2a according to a linearly polarized angle of the second light beam LL2a, which is emitted from the second light source 321.

As shown in FIG. 13, in the embodiment, the optical axis a1 of the resonance light beam pair LL1 is parallel to the optical axis a2 of the adjustment light beam LL2 in the gas cell 2, and the optical axis a1 of the resonance light beam pair LL1 is parallel to the axis line "a" of the atom cell 2. Meanwhile, in FIG. 13, the optical axis a1 and the optical axis a2 respectively coincide with the axis line "a." Since the optical axis a1 of the resonance light beam pair LL1 and the optical axis a2 of the adjustment light beam LL2 are parallel to each other, it is possible to effectively irradiate the atom cell 2 with the resonance light beam pair LL1 and the adjustment light beam LL2.

The resonance light beam pair LL1 and the adjustment light beam LL2, which pass through the atom cell 2, are incident upon the $\lambda/4$ wavelength plate 91. The $\lambda/4$ wavelength plate is a birefringent element which produces the phase difference $\pi/2(90°)$ between the polarized light beam components which are perpendicular to each other. The $\lambda/4$ wavelength plate 91 generates a resonance light beam pair LL1c by converting the resonance light beam pair LL1 from the circularly polarized light beam into the linearly polarized light beam. In addition, the $\lambda/4$ wavelength plate 91 generates adjustment light beam LL2c by converting the adjustment light beam LL2 from the circularly polarized light beam into linearly polarized light beam in a direction (perpendicular direction) which is different from that of the resonance light beam pair LL1c.

The resonance light beam pair LL1c and the adjustment light beam LL2c, which are generated by the $\lambda/4$ wavelength plate 91, are incident on the polarizer 92. The polarizer 92 allows only a light beam, which is polarized in a specific direction, to pass therethrough, thereby causing the resonance light beam pair LL1c to pass therethrough and blocking the adjustment light beam LL2c. Therefore, only the resonance light beam pair LL1c is incident on the reception section 4.

Here, the $\lambda/4$ wavelength plate 91 and the polarizer 92 are arranged between the atom cell 2 and the reception section 4, and form a "separation section" or "separator" that separates the resonance light beam pair LL1 and the adjustment light beam LL2. When the separation section is provided, it is possible to prevent or reduce the reception section 4 from receiving the adjustment light beam.

According to the second embodiment, it is possible to effectively improve the intensity of the EIT signal.

Third Embodiment

Subsequently, a third embodiment of the present disclosure will be described.

Figure 14:
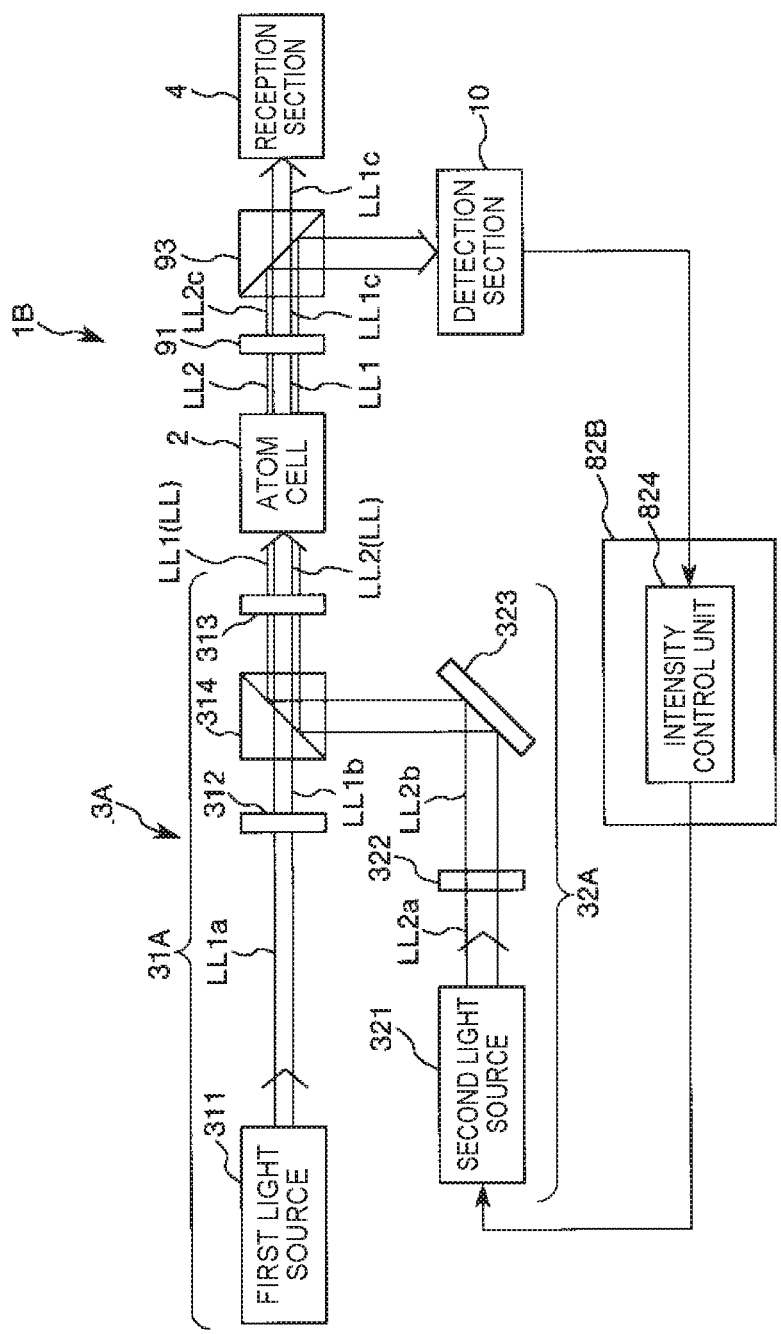
FIG. 14 is a schematic diagram illustrating an atomic oscillator (quantum interference device) according to a third embodiment of the present disclosure.

FIG. 14 is a schematic diagram illustrating an atomic oscillator (quantum interference device) according to the third embodiment of the present disclosure.

The embodiment is the same as the above-described first embodiment except that the configurations of the first light source device, the second light source device, and the control unit are different from those of the first embodiment and a $\lambda/4$ wavelength plate and a polarization beam splitter are added between the atom cell and the reception section. In addition, the embodiment is the same as the second embodiment except that the polarizer between the atom cell and the reception section is replaced with the polarization beam splitter with the different configuration of the control unit.

In the description below, the third embodiment will be described based on the difference from the above-described embodiments, and the same matters will not be repeated. In addition, in FIG. 14, the same reference symbols are used for the same configurations as those of the above-described embodiments.

An atomic oscillator 1B shown in FIG. 14 includes a polarization beam splitter 93, a detection section 10, and a light source control unit 82B.

The polarization beam splitter 93 causes the resonance light beam pair LL1c to pass therethrough without change and to be incident on the reception section 4. In addition, the polarization beam splitter 93 causes the adjustment light beam LL2c to be reflected and to be incident on the detection section 10.

Meanwhile, a $\lambda/2$ wavelength plate may be installed instead of the light attenuation filter 322. When the $\lambda/2$ wavelength plate is used, it is possible to reduce or increase the intensity of the second light beam LL2a according to a linearly polarized angle of the second light beam LL2a which is emitted from the second light source 321.

Here, the $\lambda/4$ wavelength plate 91 and the polarization beam splitter 93 are arranged between the atom cell 2 and the reception section 4, and form the separation section (i.e., a separator) that separates the resonance light beam pair LL1 and the adjustment light beam LL2. When the separation section is provided, it is possible to prevent or reduce the reception section 4 from receiving the adjustment light beam.

The detection section 10 detects the intensity of the adjustment light beam LL2c. The detection section 10 is not particularly limited and may be, for example, a light detector (light reception element), such as a photodiode, which outputs a signal according to the intensity of the received light beam.

The light source control unit 82 includes an intensity control unit 824. The intensity control unit 824 controls the output of the second light source 321 based on a detection result of the detection section 10. For example, the intensity control unit 824 performs control such that the intensity of the second light beam LL2a, which is emitted from the second light source 321, is uniform.

According to the above-described third embodiment, it is possible to effectively improve the intensity of the EIT signal.

Fourth Embodiment

Subsequently, a fourth embodiment of the present disclosure will be described.

Figure 15:
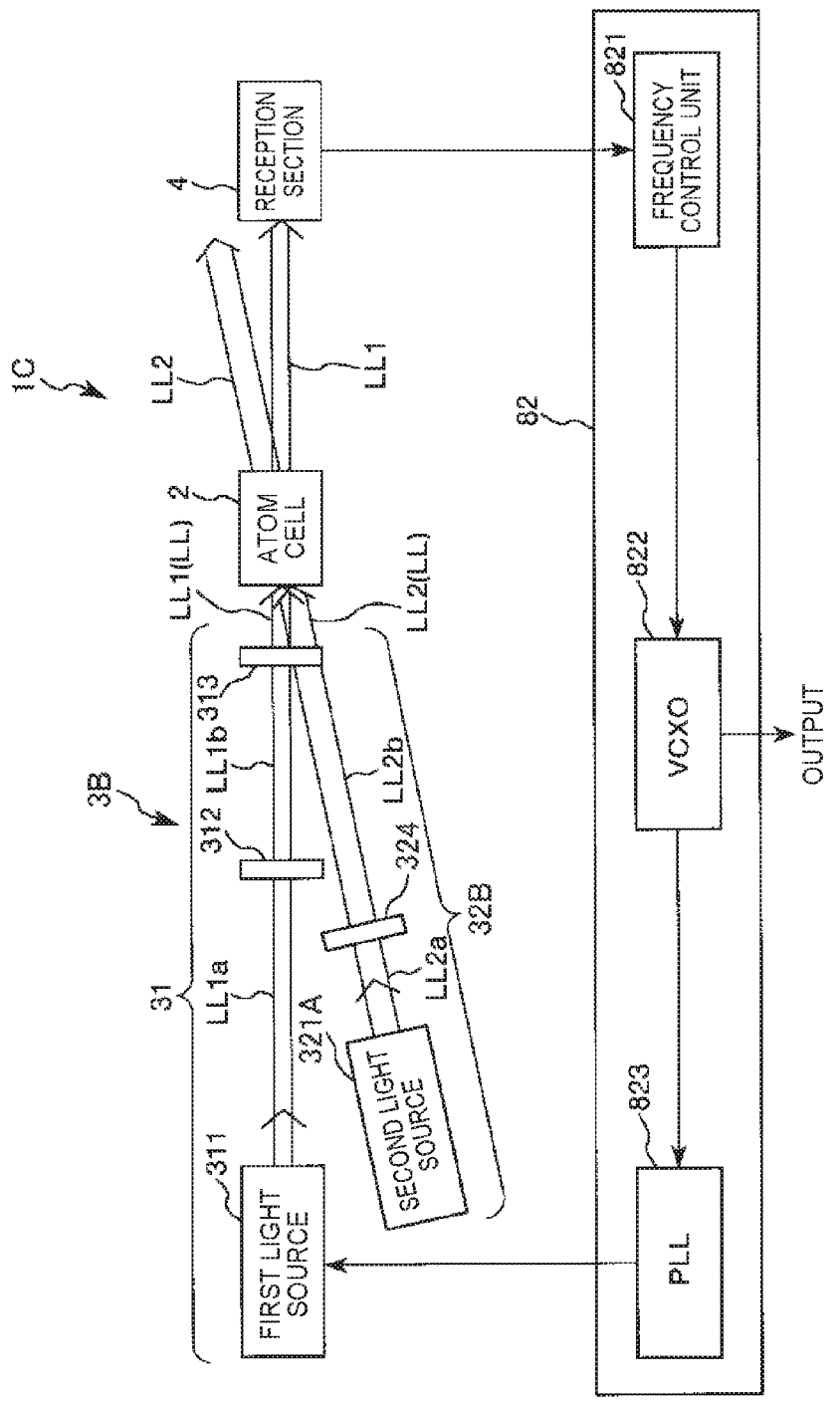
FIG. 15 is a schematic diagram illustrating an atomic oscillator (quantum interference device) according to a fourth embodiment of the present disclosure.
Figure 16:
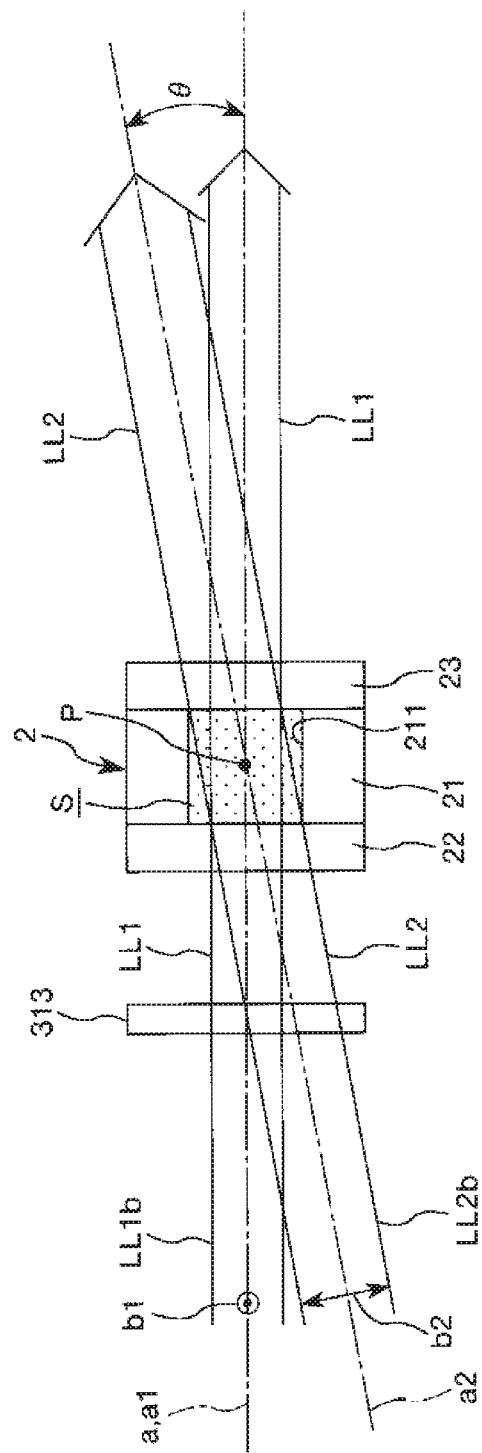
FIG. 16 is a diagram illustrating light beams respectively emitted from the first light source device and the second light source device of the light source section shown in FIG. 15.

FIG. 15 is a schematic diagram illustrating an atomic oscillator (quantum interference device) according to the fourth embodiment of the present disclosure. FIG. 16 is a diagram illustrating light beams respectively emitted from the first light source device and the second light source device of a light source section shown in FIG. 15.

This embodiment is the same as the first embodiment except that the configuration of the second light source device is different from that of the first embodiment.

In the description below, the fourth embodiment will be described based on the difference from the above-described embodiments, and the same matters will not be repeated. In addition, in FIGS. 15 and 16, the same reference symbols will be used for the same configurations as those of the above-described embodiments.

An atomic oscillator 1C shown in FIG. 15 includes a light source section 3B.

The light source section 3B includes a first light source device 31 that emits a resonance light beam pair LL1 and a second light source device 32B that emits adjustment light beam LL2.

The second light source device 32B is the same as the second light source device 32 according to the first embodiment except that a second light source 321A is used instead of the second light source 321 and a polarizer 324 is used instead of the light attenuation filter 322. That is, the second light source device 32B includes the second light source 321A, the polarizer 324, and the λ/4 wavelength plate 313.

The second light source 321A emits a second light beam LL2a that includes a resonance light beam that is linearly polarized in the same direction as the first light source 311. In particular, the second light beam LL2a includes the resonance light beam which has a larger line width than the first light beam LL1a (resonance light beam pair) from the first light source 311. Therefore, as will be described later, it is possible to generate the adjustment light beam LL2 which has a larger line width than the resonance light beam pair LL1. The second light source 321A is not particularly limited and may include, for example, a semiconductor laser, such as a surface light emitting laser or a vertical cavity surface emitting laser (VCSEL), and a light emitting element, such as a light emitting diode (LED) or organic electroluminescence (organic EL) element.

In particular, it is preferable that the second light source 321A is, for example, a light emitting element, such as a light emitting diode, which emits a non-polarized light beam. That is, it is preferable that the second light source device 32B generates the adjustment light beam LL2 using the light beam from the light emitting diode which forms the second light source 321A. Therefore, it is possible to generate the adjustment light beam LL2 which has a wide line width with a relatively simple configuration.

The second light beam LL2a is incident on the polarizer 324 from the second light source 321A, and the polarizer 324 causes the resonance light beam LL2b, which is formed of only the linearly polarized component in the specific direction and which is included in the second light beam LL2a, to pass therethrough and ejects the resonance light beam LL2b. The resonance light beam LL2b is linearly polarized in the direction (perpendicular direction) which is different from the polarization direction of the above-described resonance light beam pair LL1b.

In addition, the λ/4 wavelength plate 313 is a birefringent element which produces the phase difference π/2(90°) between the polarized light beam components which are perpendicular to each other, as described above. The λ/4 wavelength plate 313 converts the resonance light beam LL2b, which is generated by the polarizer 324, from the linearly polarized light beam to the adjustment light beam LL2 of the circularly polarized light beam (including elliptically polarized light beam). Therefore, it is possible to generate the adjustment light beam LL2 which includes the third resonance light beam. Here, the polarization direction (b2 direction shown in FIG. 16) of the linearly polarized resonance light beam LL2b is the direction (perpendicular direction) which is different from the polarization direction (b1 direction shown in FIG. 16) of the linearly polarized resonance light beam pair LL1b. Accordingly, when the resonance light beam pair LL1b and the resonance light beam LL2b are caused to pass through the common λ/4 wavelength plate 313, it is possible to generate the circularly polarized resonance light beam pair LL1 and the circularly polarized adjustment light beam LL2 in the reverse direction of the resonance light beam pair LL1. As described above, since the first light source device 31 and the second light source device 32B include the common λ/4 wavelength plate 313 through which both the resonance light beam pair LL1 and the adjustment light beam LL2 pass, it is possible to simplify the configuration of the device compared to a case in which the first light source device 31 and the second light source device 32B individually include the λ/4 wavelength plate, respectively.

In particular, since the adjustment light beam LL2 is generated using the second light beam LL2a, which has a wide line width, the adjustment light beam LL2 has a wider line width than the resonance light beam pair LL1. Therefore, it is possible to cause the alkali metal atoms of wide velocity distribution to resonate with the adjustment light beam LL2. Therefore, even when the central wavelength of the adjustment light beam LL2 is slightly deviated, it is possible to cause the alkali metal atoms at a desired velocity to resonate with the adjustment light beam LL2. As a result, it is not necessary to control the frequency of the adjustment light beam LL2, that is, the frequency of the second light source 321A, and thus it is possible to simplify the configuration of the device.

In addition, when the second light source device 32B uses a light source, which emits the non-polarized light beam, as the second light source 321A, it is possible to generate the adjustment light beam LL2 having a wide line width with a relatively simple configuration by causing the light beam from the second light source 321A to be incident upon the polarizer 324.

In the atomic oscillator 1C according to the fourth embodiment, the line width of the adjustment light beam LL2 is larger than that of the resonance light beam pair LL1, and thus it is possible to cause the alkali metal atoms of wide velocity distribution to resonate with the adjustment light beam LL2. Therefore, even when the central wavelength of the adjustment light beam LL2 is slightly deviated, it is possible to cause the alkali metal atoms at a desired velocity to resonate with the adjustment light beam LL2. As a result, it is not necessary to control the frequency of the adjustment light beam LL2, and thus it is possible to simplify the configuration of the device.

Here, since the adjustment light beam LL2 causes the alkali metal to resonate, it is possible to effectively adjust the distribution of the magnetic quantum numbers of the alkali metal atoms.

In addition, it is preferable that the wavelength band of the resonance light beam pair LL1 is outside of the wavelength band of the adjustment light beam LL2. That is, it is preferable that the wavelength band of the resonance light beam pair LL1 is not included in the wavelength band of the adjustment light beam LL2. Therefore, it is possible to reduce the generation of unnecessary signals due to the adjustment light beam LL2.

In addition, although the line width of the adjustment light beam LL2 may be larger than the line width of the resonance light beam pair LL1, it is preferable that the line width of the adjustment light beam LL2 is larger than the line width of the resonance light beam pair LL1 by 1.5 times or higher and 1000 times or less, and it is further preferable that the line width of the adjustment light beam LL2 is larger than the line width of the resonance light beam pair LL1 by 10 times or higher and 100 times or less. Therefore, even when the central wavelength of the adjustment light beam LL2 is slightly deviated, it is possible to cause the alkali metal atoms at a desired velocity to resonate with the adjustment light beam LL2.

According to the fourth embodiment, it is possible to effectively improve the intensity of the EIT signal.

Fifth Embodiment

Subsequently, a fifth embodiment of the present disclosure will be described.

Figure 17:
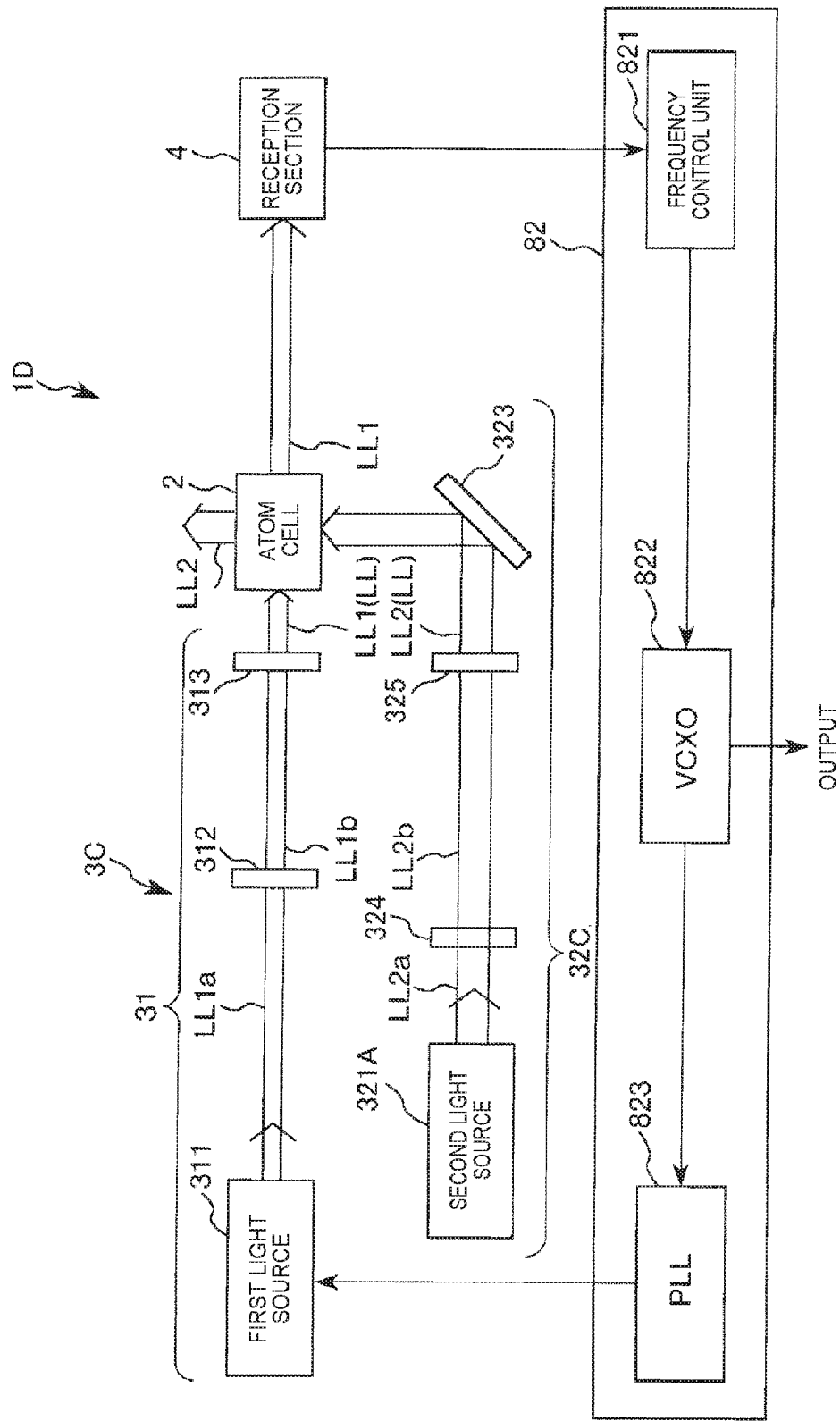
FIG. 17 is a schematic diagram illustrating an atomic oscillator (quantum interference device) according to a fifth embodiment of the present disclosure.
Figure 18:
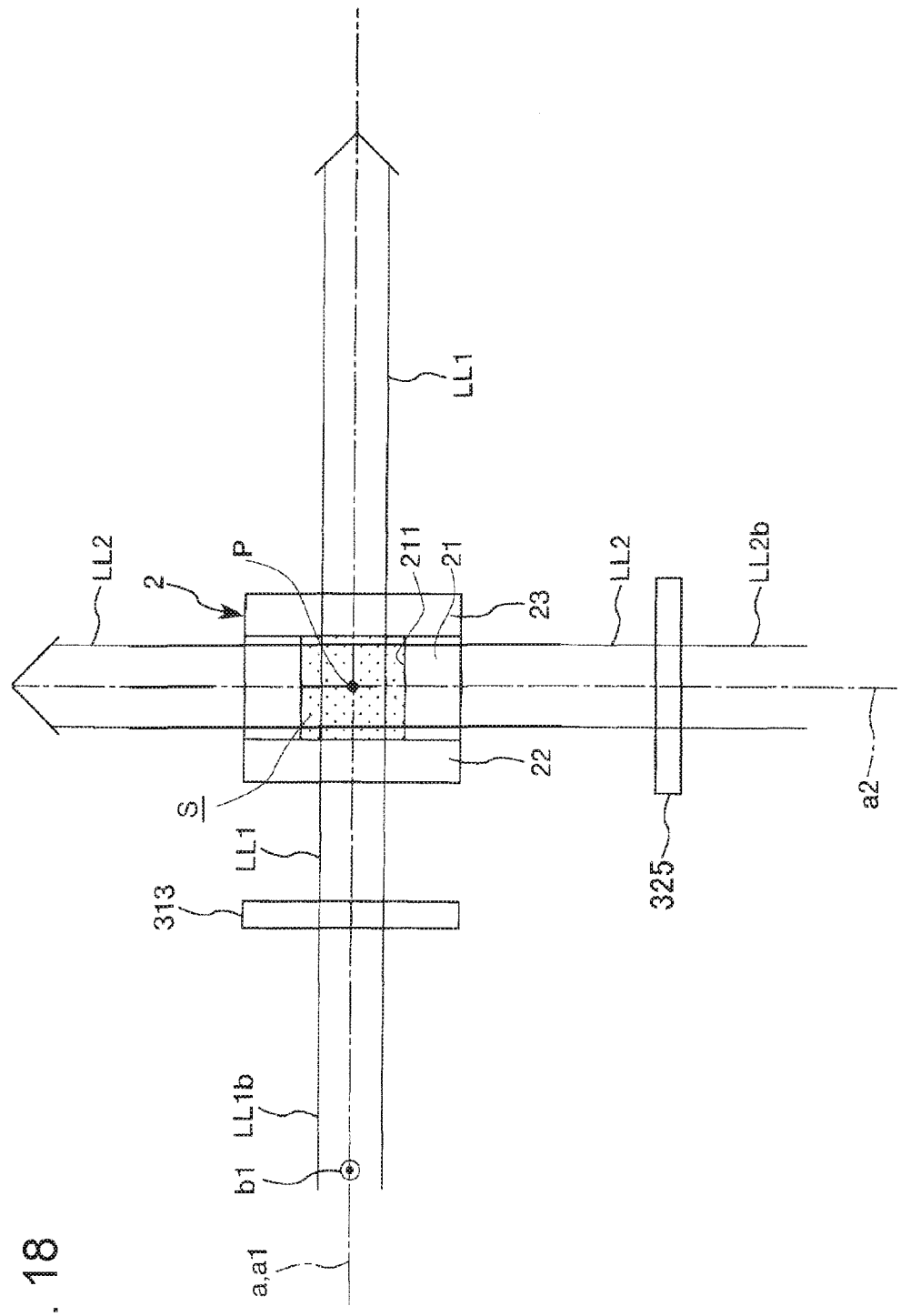
FIG. 18 is a diagram illustrating light beams respectively emitted from the first light source device and the second light source device of the light source section shown in FIG. 17.

FIG. 17 is a schematic diagram illustrating an atomic oscillator (quantum interference device) according to the fifth embodiment of the present disclosure. FIG. 18 is a diagram illustrating light beams respectively emitted from the first light source device and the second light source device of a light source section shown in FIG. 17.

The embodiment is the same as the fourth embodiment except that the configuration of the second light source device is different from that of the fourth embodiment.

In the description below, the fifth embodiment will be described based on the difference from the above-described embodiments, and the same matters will not be repeated. In addition, in FIGS. 17 and 18, the same reference symbols will be used for the same configurations as those of the above-described embodiments.

An atomic oscillator 1D shown in FIG. 17 includes a light source section 3C.

The light source section 3C includes a first light source device 31 which emits a resonance light beam pair LL1 and a second light source device 32C which emits adjustment light beam LL2.

The second light source device 32C is formed to be the same as the second light source device 32B according to the fourth embodiment except that the λ/4 wavelength plate 313 is omitted and a/4 wavelength plate 325 and a mirror 323 are added between the polarizer 324 and the atom cell 2. That is, the second light source device 32C includes the second light source 321A, the polarizer 324, the λ/4 wavelength plate 325, and the mirror 323.

The λ/4 wavelength plate 325 is a birefringent element which produces the phase difference π/2(90°) between the polarized light beam components which are perpendicular to each other. The λ/4 wavelength plate 325 converts the resonance light beam LL2b, which is generated by the polarizer 324, from the linearly polarized light beam to the adjustment light beam LL2 of the circularly polarized light beam (including the elliptically polarized light beam). When the second light source device 32C includes the λ/4 wavelength plate 325, which is separated from the λ/4 wavelength plate 313 of the first light source device 31, it is possible to increase the degree of freedom when the second light source device 32C is installed.

The adjustment light beam LL2, which is generated by the λ/4 wavelength plate 325, is reflected in the mirror 323 and is incident upon the atom cell 2. Meanwhile, the mirror 323 may be omitted. In this case, the second light source 321A and the polarizer 324 may be installed in the direction such that the adjustment light beam LL2 is incident upon the atom cell 2.

In particular, in the embodiment, as shown in FIG. 18, the adjustment light beam LL2 is incident on the internal space S through the body part 21 of the atom cell 2. Therefore, it is possible to prevent or reduce the reception section 4 from receiving the adjustment light beam LL2. Meanwhile, in FIG. 18, the mirror 323 is not shown in the drawing for convenience of explanation.

According to the above-described fifth embodiment, it is possible to effectively improve the intensity of the EIT signal.

2. Electronic Device

It is possible to embed the atomic oscillator as described above into various electronic devices.

Hereinafter, an electronic device according to the present disclosure will be described.

Figure 19:
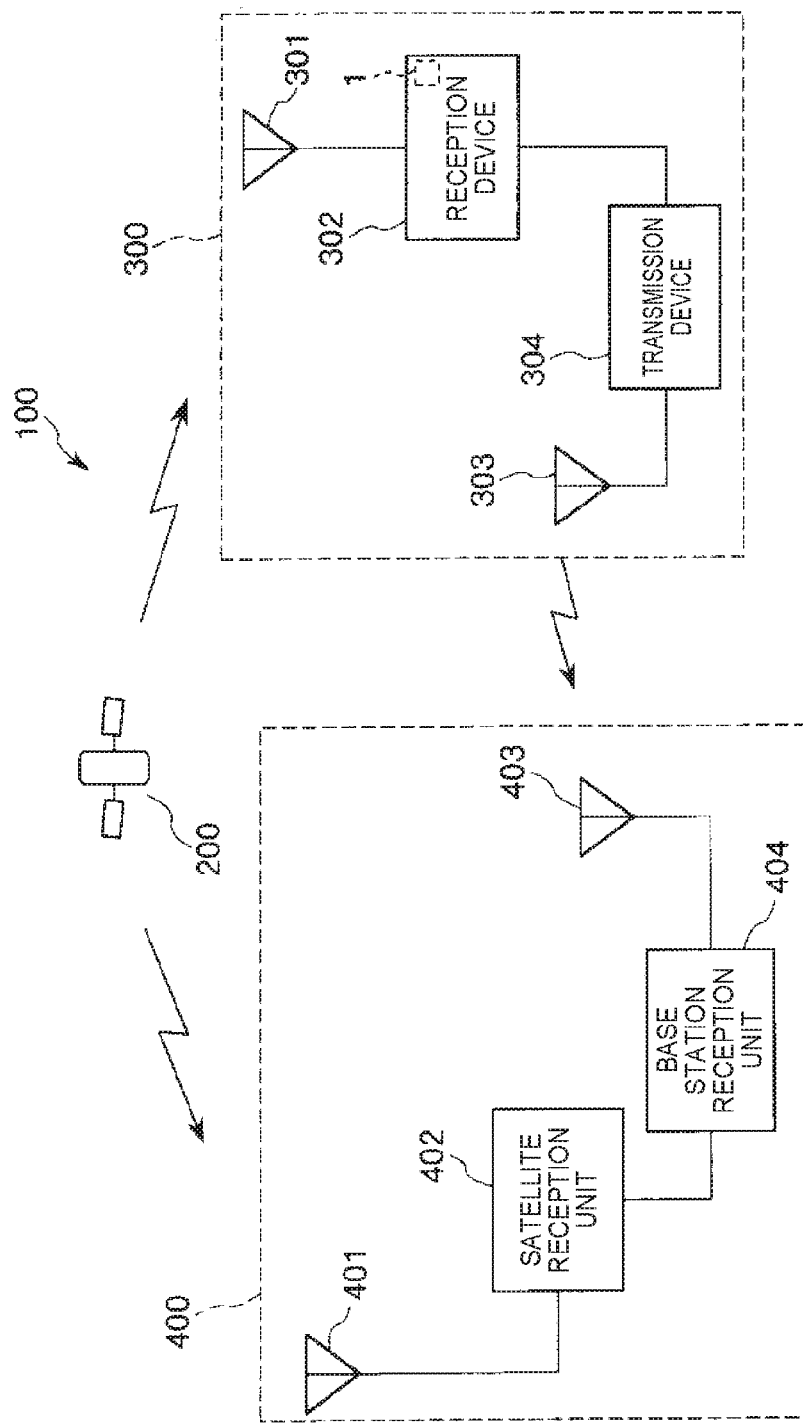
FIG. 19 is a diagram illustrating the schematic configuration of a case in which the atomic oscillator according to the present disclosure is used for a positioning system using GPS satellites.

FIG. 19 is a diagram illustrating a schematic configuration of a case in which the atomic oscillator according to the present disclosure is used for a positioning system using GPS satellites.

A positioning system 100 shown in FIG. 19 includes a GPS satellite 200, a base station device 300, and a GPS reception device 400.

The GPS satellite 200 transmits positioning information (GPS signal).

The base station device 300 includes, for example, a reception device 302 that highly-preciously receives positioning information from the GPS satellite 200 through an antenna 301 which is installed at an electronic reference point (GPS continuous observation station), and a transmission device 304 that transmits the positioning information, which is received by the reception device 302, through an antenna 303.

Here, the reception device 302 is an electronic device which includes the atomic oscillator 1 according to the present disclosure as a reference frequency oscillation source. The reception device 302 has excellent reliability. In addition, the positioning information, which is received by the reception device 302, is transmitted by the transmission device 304 in real time.

The GPS reception device 400 includes a satellite reception unit 402 that receives the positioning information from the GPS satellite 200 through an antenna 401, and a base station reception unit 404 that receives the positioning information from the base station device 300 through an antenna 403.

3. Moving Object

Figure 20:
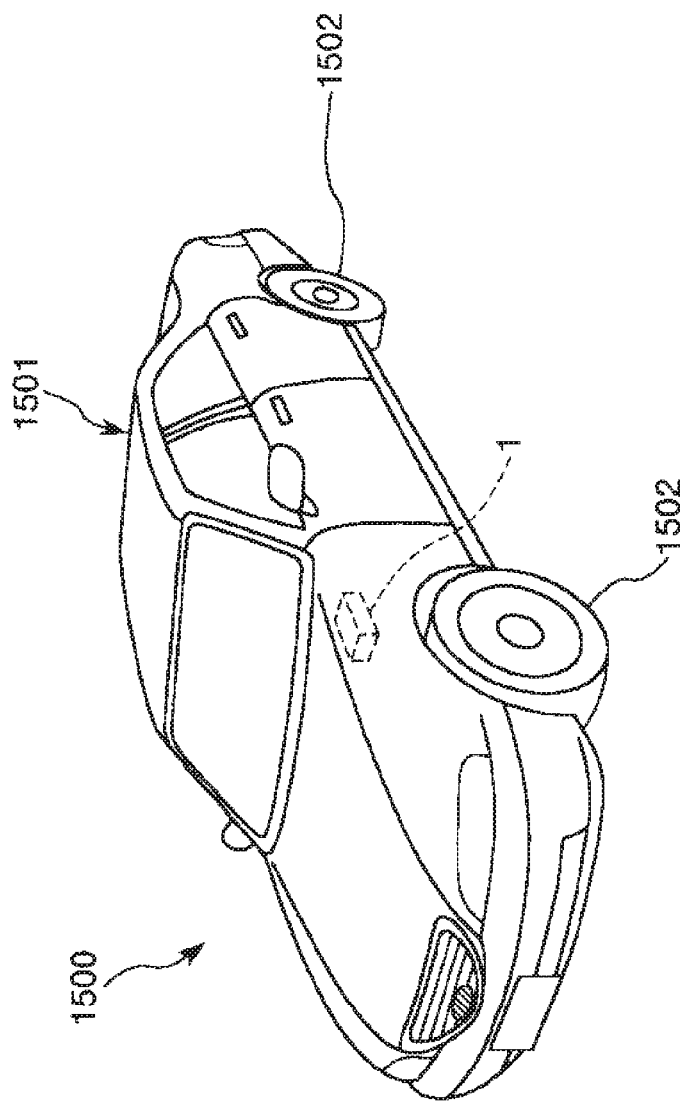
FIG. 20 is a diagram illustrating an example of a moving object according to the present disclosure.

FIG. 20 is a diagram illustrating an example of a moving object according to the present disclosure.

In the drawing, the moving object 1500 includes a vehicle body 1501 and four vehicle wheels 1502, and is configured to rotate the vehicle wheels 1502 using a power source (engine) which is provided in the vehicle body 1501 and which is not shown in the drawing. The atomic oscillator 1 is built in the moving object 1500.

Meanwhile, the electronic device according to the present disclosure is not limited to the above-described device, and it is possible to apply the electronic device to, for example, a mobile phone, a digital still camera, an ink-jet type discharge device (for example, an ink-jet printer), a personal computer (a mobile-type personal computer or a laptop-type personal computer), a television, a video camera, a videotape recorder, a car navigation device, a pager, an electronic organizer (including a communication function), an electronic dictionary, an electronic calculator, an electronic game device, a word processor, a work station, a video telephone, a television monitor for preventing crimes, an electronic binocular telescope, a POS terminal, a medical instrument (for example, a clinical electronic thermometer, a sphygmomanometer, a blood sugar meter, an electrocardiographic apparatus, an ultrasonic diagnostic device, or an electronic endoscope), a fish finder, various measurement devices and meters (for example, meters for a vehicle, an airplane, and a ship), a flight simulator, terrestrial digital broadcasting, a mobile base station, a GPS module, and the like.

Hereinabove, the quantum interference device, the atomic oscillator, the electronic device, and the moving object according to the present disclosure are described based on the embodiments with reference to the accompanying drawings. However, the present disclosure is not limited thereto.

In addition, it is possible to replace the configuration of each of the units according to the present disclosure by an arbitrary configuration which expresses the same function as in the above-described embodiment. In addition, it is possible to add an arbitrary configuration. In addition, the present disclosure may be accomplished by combining the arbitrary configurations of the above-described respective embodiments.

What is claimed is:

1. A quantum interference device comprising:
an atom cell filled with metal;
a first light source device emitting a first light beam, wherein the first light beam includes a resonance light beam pair configured to be circularly polarized with each other in the same direction and configured to cause the metal to resonate;
a second light source device emitting a second light beam, wherein the second light beam is circularly polarized in a reverse direction to the resonance light beam pair; and
a reception device receiving the resonance light beam pair passing through the atom cell,
wherein the second light beam includes a resonance light beam that causes the metal to resonate, and
the resonance light beam pair is one of a line D1 and a line D2, and the resonance light beam is the other of the line D1 and the line D2.

2. The quantum interference device according to claim 1 wherein:
the first light source device includes a first light source that emits a linearly polarized light beam,
the second light source device includes a second light source that emits a linearly polarized light beam, and
the first light source device and the second light source device include a common $\lambda/4$ wavelength plate through which the light beams from both the first light source and the second light source pass.

3. The quantum interference device according to claim 1 wherein an optical axis of the first light beam and an optical axis of the second light beam are perpendicular to each other.

4. The quantum interference device according to claim 1 wherein, in the atom cell, a transmission area of the first light beam is included in a transmission area of the second light beam.

5. The quantum interference device according to claim 1 wherein the second light source device includes a light emitting diode that generates the second light beam.

6. The quantum interference device according to claim 1 wherein the second light source device includes a light source that emits a non-polarized light beam, and a polarizer upon which the light beams from the light source is incident.

7. The quantum interference device according to claim 1 wherein:
the atom cell includes a pair of window parts and a body part arranged between the pair of window parts, wherein the body part and the pair of window parts form an internal space that is filled with the metal, and
the second light beam passes through the body part and is incident upon the internal space.

8. An atomic oscillator comprising the quantum interference device according to claim 1.

9. An electronic device comprising the quantum interference device according to claim 1.

10. A moving object comprising the quantum interference device according to claim 1.

* * * * *